(12) United States Patent
Yang et al.

(10) Patent No.: US 12,235,297 B2
(45) Date of Patent: Feb. 25, 2025

(54) CURRENT SAMPLING SYSTEM AND METHOD FOR MAGNETIC COMPONENT, MAGNETIC COMPONENT, AND POWER CONVERTER

(71) Applicant: Huawei Digital Power Technologies Co., Ltd., Shenzhen (CN)

(72) Inventors: Zezhou Yang, Dongguan (CN); Liqiong Yi, Shenzhen (CN); Zehua Liang, Dongguan (CN); Shu Zhong, Dongguan (CN); Tao Xie, Shenzhen (CN)

(73) Assignee: HUAWEI DIGITAL POWER TECHNOLOGIES CO., LTD., Shenzhen (CN)

( * ) Notice: Subject to any disclaimer, the term of this patent is extended or adjusted under 35 U.S.C. 154(b) by 94 days.

(21) Appl. No.: 18/148,439

(22) Filed: Dec. 30, 2022

(65) Prior Publication Data

US 2023/0194579 A1 Jun. 22, 2023

Related U.S. Application Data

(63) Continuation of application No. PCT/CN2020/100222, filed on Jul. 3, 2020.

(51) Int. Cl.
*G01R 19/10* (2006.01)
*G01R 19/25* (2006.01)
(Continued)

(52) U.S. Cl.
CPC ......... *G01R 19/2509* (2013.01); *G01R 19/10* (2013.01); *H01F 38/14* (2013.01); *H02M 5/10* (2013.01)

(58) Field of Classification Search
CPC .. G01R 15/183; G01R 19/0092; G01R 19/10; G01R 19/2509; H01F 27/402; H01F 38/14; H02M 5/10
See application file for complete search history.

(56) References Cited

U.S. PATENT DOCUMENTS 6,628,531 B2 * 9/2003 Dadafshar ............... H05K 1/165
336/200
9,178,369 B2 * 11/2015 Partovi ................... H02J 50/90
(Continued)

FOREIGN PATENT DOCUMENTS

CN 103578706 A 2/2014
CN 103675401 A 3/2014
(Continued)

*Primary Examiner* — Vinh P Nguyen
(74) *Attorney, Agent, or Firm* — SLATER MATSIL, LLP

(57) ABSTRACT

A current sampling system, the system including a magnetic component, that is an inductor or a transformer that has at least one winding, where the at least one winding has a first part and a second part, where a first terminal of the first part is connected to a first terminal of the second part, and where a second terminal of the first part is separated from a second terminal of the second part, and a current detection circuit, where the second terminal of the second part is connected to the current detection circuit, and where the current detection circuit is configured to sample a current flowing through the second part, and obtain a total current of the winding based on the sampled current flowing through the second part and a preset ratio.

20 Claims, 30 Drawing Sheets

(51) Int. Cl.
*H01F 38/14* (2006.01)
*H02M 5/10* (2006.01)

(56) References Cited

U.S. PATENT DOCUMENTS

| | | |
|---|---|---|
| 9,638,727 B2 | 5/2017 | Zheng et al. |
| 10,473,273 B1 * | 11/2019 | Zolotykh ............... H05B 45/39 |
| 11,444,485 B2 * | 9/2022 | Partovi ................. H01F 27/366 |
| 2016/0254706 A1 * | 9/2016 | Saen ....................... H02J 50/12 |
| | | 307/104 |
| 2016/0261146 A1 * | 9/2016 | Saen .................... H01F 27/363 |
| 2020/0150154 A1 * | 5/2020 | Chang ............... H02M 3/33592 |
| 2021/0118610 A1 | 4/2021 | Sun et al. |

FOREIGN PATENT DOCUMENTS

| | | |
|---|---|---|
| CN | 104485198 A | 4/2015 |
| CN | 110706903 A | 1/2020 |
| EP | 3133405 A1 | 2/2017 |

\* cited by examiner

CURRENT SAMPLING SYSTEM AND METHOD FOR MAGNETIC COMPONENT, MAGNETIC COMPONENT, AND POWER CONVERTER

CROSS-REFERENCE TO RELATED APPLICATIONS

This application is a continuation of International Application No. PCT/CN2020/100222, filed on Jul. 3, 2020, the disclosure of which is hereby incorporated by reference in its entirety.

TECHNICAL FIELD

This application relates to the field of electrical component technologies, and in particular, to a current sampling system and method for a magnetic component, a magnetic component, and a power converter.

BACKGROUND

A magnetic component is a core component in a power electronics converter. To control a working state of the magnetic component and implement efficient energy conversion, a current of the magnetic component needs to be sampled.

FIG. 1 is a diagram of a sampling circuit for detecting a current of a magnetic component.

A sampling resistor R is connected to one terminal of the magnetic component. When a current I flows through R, a voltage V is generated on R. It may be learned, according to the Ohm's law, that after the voltage V between two terminals of R is detected, a current I of the magnetic component can be obtained.

However, in a process of sampling the current of the magnetic component by using the sampling resistor, when a current flows through the sampling resistor, a heat loss is generated in a circuit. A magnitude of the heat loss may be obtained by multiplying a square of the current by a resistance of the sampling resistor. Therefore, when the current of the magnetic component is sampled, a large heat loss is generated in the circuit.

SUMMARY

This application provides a current sampling system and method for a magnetic component, and a magnetic component, so that a heat loss generated in a circuit can be reduced when a current of the magnetic component is detected.

According to a first aspect, a current sampling system for a magnetic component is provided, including a magnetic component and a current detection circuit, where the magnetic component includes at least one winding. To reduce a heat loss generated in a circuit, in the technical solutions of this application, the winding is split into a plurality of parts, so that a total current of the winding is a sum of currents of the parts, and the current of each part of the winding is lower than the total current of the winding. Therefore, after a current of any part in the parts is sampled, the total current of the winding may be obtained based on a preset ratio.

Specifically, the magnetic component is an inductor or a transformer, and the inductor or the transformer includes at least one winding. The winding includes at least a first part and a second part. A first terminal of the first part is connected to a first terminal of the second part, a second terminal of the first part is separated from a second terminal of the second part, and the second terminal of the second part is connected to the current detection circuit. The current detection circuit is configured to sample a current flowing through the second part, and obtain a total current of the winding based on the sampled current flowing through the second part and a preset ratio, where the total current of the winding is a sum of a current flowing through the first part and the current flowing through the second part.

In this application, the winding is split into a plurality of parts. The total current of the winding is not directly sampled. Instead, a current of a part of the winding is sampled, so that a sampled current is reduced. Therefore, when a current of any part in the parts of the winding is measured, the heat loss generated in the circuit is reduced.

In a first possible implementation of the first aspect, the preset ratio is a ratio of the total current flowing through the winding to the current flowing through the second part, and the preset ratio may be obtained in advance through experiment. After the preset ratio is obtained, the total current of the winding may be obtained based on the sampled current flowing through the second part and the preset ratio.

In a second possible implementation of the first aspect, to reduce the loss generated in the current in an actual operation process, the current detection circuit samples a smaller current in the current of the first part and the current of the second part. Therefore, the current flowing through the first part may be greater than the current flowing through the second part, so that the current detection circuit is disposed in the second part. When the to-be-sampled current is reduced, the heat loss generated in the circuit can be reduced.

With reference to the second possible implementation of the first aspect, in a third possible implementation, when a current of a winding formed by winding N strands of Litz wires is directly sampled by using the current detection circuit, a total current flowing through the winding is large, a total current of the winding that is sampled by the current detection circuit is also large, and a large heat loss is generated in the circuit. To reduce the heat loss generated in the circuit, a current directly sampled by the current detection circuit needs to be reduced. Therefore, in this application, the winding formed by winding the N strands of Litz wires is split into two parts, a first part includes N1 strands of Litz wires, a second part includes N2 strands of Litz wires, both N1 and N2 are positive integers, and the preset ratio is (N1+N2)/N2.

With reference to the third possible implementation of the first aspect, in a fourth possible implementation, to further reduce the heat loss generated in the circuit, the current detection circuit samples only a winding with a smaller quantity of strands of Litz wires. When N1 is greater than N2, a quantity N1 of strands of Litz wires of a first winding is greater than a quantity N2 of strands of Litz wires of a second winding. Therefore, a current flowing through the second winding is lower than a current flowing through the first winding, and the current detection circuit samples only the current of the second winding. When the to-be-sampled current is reduced, the heat loss generated in the circuit can be reduced.

With reference to the second possible implementation of the first aspect, in a fifth possible implementation, when a current of a, printed circuit board (PCB) winding is directly sampled by using the current detection circuit, a total current flowing through the PCB winding is large, a total current of the PCB winding that is sampled by the current detection circuit is also large, and a large heat loss is generated in the circuit. To reduce the heat loss generated in the circuit, a current directly sampled by the current detection circuit needs to be reduced. Therefore, in this application, the PCB winding is split into two parts, a width of a first part is B1, a width of a second part is B2, and the preset ratio is (B1+B2)/B2.

With reference to the fifth possible implementation of the first aspect, in a sixth possible implementation, to further reduce the heat loss generated in the circuit, the current detection circuit samples only a winding with a smaller width. When B1 is greater than B2, a width B1 of a first winding is greater than a width B2 of a second winding. Therefore, a current flowing through the second winding is lower than a current flowing through the first winding, and the current detection circuit samples only the current of the second winding. When the to-be-sampled current is reduced, the heat loss generated in the circuit can be reduced.

With reference to the second to the sixth possible implementations of the first aspect, in a seventh possible implementation, when the magnetic component is an inductor, the inductor is an integrated inductor.

With reference to the second to the sixth possible implementations of the first aspect, in an eighth possible implementation, when the magnetic component is a transformer, the winding is a primary-side winding or a secondary-side winding of the transformer.

With reference to the eighth possible implementation of the first aspect, in a ninth possible implementation, the transformer is an integrated transformer, and the winding is at least one of a primary-side winding and a secondary-side winding of the integrated transformer.

With reference to the first aspect and any one of the foregoing possible implementations, in a tenth possible implementation, the current detection circuit includes a sampling resistor, an analog-to-digital conversion module, and a controller, where a first terminal of the sampling resistor is connected to the second terminal of the second part, and a second terminal of the sampling resistor is connected to the second terminal of the first part, the analog-to-digital conversion module is configured to collect a voltage between the two terminals of the sampling resistor, obtain, based on a resistance of the sampling resistor and the voltage between the two terminals of the sampling resistor, the current flowing through the second part, and send the current flowing through the second part to the controller, and the controller is configured to obtain the total current of the winding based on the current flowing through the second part and the preset ratio.

A current flowing through the sampling resistor is the current of the second winding instead of the total current flowing through the winding. The current of the second winding is lower than the total current of the winding. Therefore, after the winding is split into two parts, a heat loss generated on the sampling resistor R is reduced.

With reference to the first aspect and any one of the foregoing possible implementations, in an eleventh possible implementation, the current detection circuit includes a current transformer, a sampling resistor, an analog-to-digital conversion module, and a controller, where a first terminal of a primary-side winding of the current transformer is connected to the second terminal of the second part, a second terminal of the primary-side winding of the current transformer is connected to the second terminal of the first part, and a first terminal and a second terminal of a secondary-side winding of the current transformer are respectively connected to two terminals of the sampling resistor, the analog-to-digital conversion module is configured to collect a voltage between the two terminals of the sampling resistor, and send the collected voltage to the controller, and the controller is configured to obtain the total current of the winding based on the collected voltage, a resistance of the sampling resistor, and the preset ratio.

After a larger current of the primary-side winding is converted into a smaller current of the secondary-side winding by using the current transformer, a current flowing through the sampling resistor is further reduced, to reduce a heat loss generated on the sampling resistor. In addition, the current of the second winding is lower than the total current of the winding. Therefore, when the larger current of the primary-side winding is converted into the smaller current of the secondary-side winding by using the current transformer, a current transformer with a large capacity is not required, to reduce a volume of the current transformer that needs to be used, and reduce space occupied by the current transformer.

With reference to the first aspect and any one of the foregoing possible implementations, in a twelfth possible implementation, the current detection circuit includes a magnetic sensor and a controller, where the magnetic sensor is configured to collect the current flowing through the second part, and send the current flowing through the second part to the controller, and the controller is configured to obtain the total current of the winding based on the current flowing through the second part and the preset ratio.

According to a second aspect, a current sampling method for a magnetic component is provided. After a winding is split into a plurality of parts, a total current of the winding is a sum of currents of the parts, and the current of each part is lower than the total current of the winding. After a current of any part in the parts of the winding is sampled, the total current of the winding may be obtained based on a ratio of the current of the part to the total current of the winding. In the current sampling method, a case in which the total current of the winding is directly sampled can be avoided, only a current of any part of the winding needs to be detected, and the current of the any part is lower than the total current of the winding, so that a to-be-sampled current is reduced. Therefore, in the current sampling method, when a current of the winding is sampled, the to-be-sampled current can be reduced, to reduce a heat loss generated in a circuit.

Specifically, the magnetic component is an inductor or a transformer, and the inductor or the transformer includes at least one winding. The winding includes at least the following two parts, including a first part and a second part. A first terminal of the first part is connected to a first terminal of the second part, a second terminal of the first part is separated from a second terminal of the second part, and the second terminal of the second part is connected to a current detection circuit. The method includes sampling a current flowing through the second part, and obtaining a total current of the winding based on the current flowing through the second part and a preset ratio, where the total current of the winding is a sum of a current flowing through the first part and the current flowing through the second part.

According to a third aspect, a magnetic component is provided, where the magnetic component is an inductor or a transformer, and the inductor or the transformer includes at least one winding. A winding of the magnetic component is split into a plurality of parts, so that a total current of the winding is a sum of current values of the parts, and the current of each part is lower than the total current of the winding. After sampling a current of any part in the parts of the winding, a current detection circuit may obtain the total current of the winding based on a ratio of the current of the part to the total current of the winding. Therefore, a case in which the total current of the winding is directly sampled by using the current sampling circuit is avoided, the current detection circuit needs to sample only a current of any part of the winding, and the current of the any part is lower than the total current of the winding, so that a to-be-sampled current is reduced, to reduce a heat loss generated in a circuit.

Specifically, a first terminal of a first part is connected to a first terminal of a second part, and a second terminal of the first part is separated from a second terminal of the second part. The second terminal of the second part is configured to be connected to the current detection circuit, so that the current detection circuit obtains a total current of the winding based on a current flowing through the second part and a preset ratio, where the total current of the winding is a sum of a current flowing through the first part and the current flowing through the second part.

With reference to the third aspect, in a first possible implementation, the winding is formed by winding a Litz wire, the first part includes N1 strands of Litz wires, the second part includes N2 strands of Litz wires, both N1 and N2 are positive integers, and the preset ratio is (N1+N2)/N2.

With reference to the third aspect, in a second possible implementation, the winding is a PCB winding, a width of the first part is B1, a width of the second part is B2, and the preset ratio is (B1+B2)/B2.

With reference to the third aspect and either of the foregoing possible implementations, in a fourth possible implementation, when the magnetic component is an inductor, the inductor is an integrated inductor.

With reference to the third aspect and either of the foregoing possible implementations, in a fifth possible implementation, when the magnetic component is a transformer, the winding is at least one of a primary-side winding and a secondary-side winding of the transformer.

With reference to the third aspect and either of the foregoing possible implementation, in a sixth possible implementation, when the transformer is an integrated transformer, the winding is at least one of a primary-side winding and a secondary-side winding of the integrated transformer.

It can be learned from the foregoing technical solutions that embodiments of this application have the following advantages.

In this solution, the total current of the magnetic component is not directly measured. Instead, a current flowing through a part of the magnetic component is measured. Because the current of the part is less than the total current flowing through the magnetic component, a heat loss can be reduced by measuring a small current.

The current sampling system for a magnetic component provided in this application includes the magnetic component and the current detection circuit. In the system, the magnetic component is split into at least two parts. A current of a part thereof is measured, and then the total current of the magnetic component is obtained based on the measured current and the preset ratio, to resolve a problem that a large heat loss is generated by directly measuring the total current of the magnetic component. The magnetic component includes the at least one winding. The winding is split into two parts, or may be split into more parts, for example, three parts or four parts. Because the total current of the winding is the sum of the currents flowing through the parts, the current of each part is lower than the total current of the winding. When the total current of the winding is measured, a current of a part in the parts is sampled by using the current detection circuit, that is, the sampled current is reduced. Therefore, when the measured current is used, the heat loss generated in the circuit is reduced. When the winding is split into two parts, the winding is divided into the first part and the second part, the first terminal of the first part is connected to the first terminal of the second part, the second terminal of the first part is separated from the second terminal of the second part, and the second terminal of the second part is connected to the current detection circuit. The current of the second part is lower than the total current of the winding, and when the current detection circuit samples the current of the second part, the sampled current is low. When the sampled current is low, and the current of the second part of the winding is detected, the heat loss generated in the circuit is reduced. After the current of the second part is obtained, the total current of the winding may be obtained based on the preset ratio. Therefore, in the technical solutions of this application, when a current of the magnetic component is detected, the heat loss generated in the circuit can be reduced.

DETAILED DESCRIPTION OF ILLUSTRATIVE EMBODIMENTS

To enable a person skilled in the art to better understand the technical solutions provided in embodiments of this application, the following first describes a current sampling system for a magnetic component.

System Embodiment 1

The magnetic component includes a winding, and detecting a current of the magnetic component is detecting a current flowing through the winding. When a large current is measured, a large heat loss is generated in a circuit.

To resolve a problem that a large heat loss is generated in the circuit when the current of the winding is sampled, Embodiment 1 of this application provides a current sampling system for a magnetic component. The current sampling system includes a magnetic component and a current detection circuit, and the magnetic component includes at least one winding. To reduce a heat loss generated in a circuit, in the technical solutions of this application, the winding is split into a plurality of parts, so that a total current of the winding is a sum of currents of the parts, and the current of each part of the winding is lower than the total current of the winding. Therefore, after a current of any part in the parts is sampled, the total current of the winding may be obtained based on a preset ratio. In this application, the winding is split into a plurality of parts. The total current of the winding is not directly sampled. Instead, a current of a part of the winding is sampled, so that a sampled current is reduced. Therefore, when a current of any part in the parts of the winding is measured, the heat loss generated in the circuit is reduced.

To detect a current less than the total current, the winding that is in the magnetic component and on which current sampling is to be performed is split into at least two parts, and may be split into two parts, or may be split into more parts, for example, three parts or four parts. This is not specifically limited in this application. For ease of description and for ease of implementation by a person skilled in the art, the following is described by using an example in which the winding is split into two parts.

The magnetic component may include one winding, or may include two or more windings. For a winding on which current sampling needs to be performed, the technical solutions disclosed in this application may be used.

Figure 1:
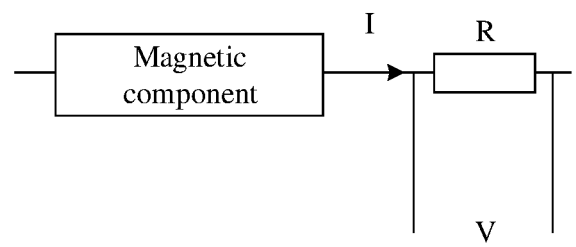
FIG. 1 is a diagram of a sampling circuit for detecting a current of a magnetic component.
Figure 2:
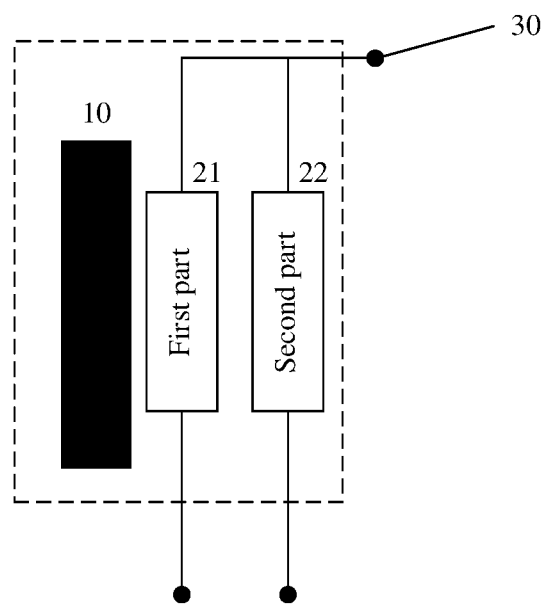
FIG. 2 is a schematic diagram of a magnetic component according to an embodiment of this application.

FIG. 2 is a schematic diagram of a magnetic component according to an embodiment of this application.

A type of the magnetic component is not limited in this application. The magnetic component may be an inductor or a transformer. The magnetic component may include a magnetic core, or may not include a magnetic core. For example, when the magnetic component is an inductor, the inductor may be an air-core inductor, and the air-core inductor does not include a magnetic core.

For ease of description, the following is described in detail by using an example in which the magnetic component includes a magnetic core.

The magnetic component includes a magnetic core 10, and a winding of the magnetic component is split into a first part 21 and a second part 22.

The first part 21 and the second part 22 are wound on the magnetic core 10 in a same manner. The magnetic core 10 is a common core of the first part 21 and the second part 22.

A first terminal of the first part 21 and a first terminal of the second part 22 are connected to a common pin 30. A second terminal of the first part 21 is separated from a second terminal of the second part.

A total current flowing through the winding in this application may be a sum of a current flowing from the common pin 30 into the first part 21 and a current flowing from the common pin 30 into the second part 22, or may be a sum of a current flowing out from the first part 21 to the common pin 30 and a current flowing out from the second part 22 to the common pin 30. Therefore, both a current of the first part 21 and a current of the second part 22 are lower than the total current of the winding.

With reference to the magnetic component described above, the following describes in detail the current sampling system provided in this application.

Figure 3:
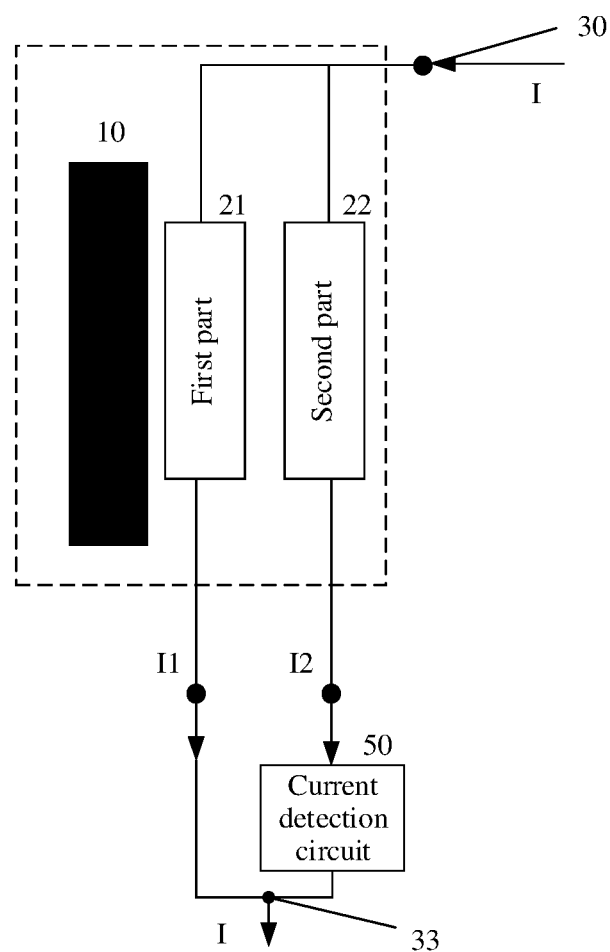
FIG. 3 is a schematic diagram of a current sampling system according to an embodiment of this application.

FIG. 3 is a schematic diagram of a current sampling system according to an embodiment of this application.

The current sampling system includes a current detection circuit 50 and the magnetic component described above.

A specific location of the current detection circuit 50 is not limited in this application. The current detection circuit 50 may be located in the first part 21 to sample the current of the first part 21, or the current detection circuit 50 may be located in the second part 22 to sample the current of the second part 22. For ease of description, the following is described in detail by using an example in which the current detection circuit 50 is located in the second part 22.

When the current detection circuit 50 is located in the second part 22, a first terminal of the current detection circuit 50 is connected to the second terminal of the second part 22, and a second terminal of the current detection circuit 50 and the second terminal of the first part 21 are connected to a merged pin 33.

The first part 21 and the second part 22 constitute a parallel structure, and a total current I flowing from the common pin 30 into the winding is a sum of a current I1 of the first part 21 and a current I2 of the second part.

When a current flows through the second part 22, the current detection circuit 50 may sample the current I2 of the second part.

The to-be-sampled current I2 of the second part 22 is a partial current in the total current I of the winding, and the to-be-sampled current I2 of the second part 22 is lower than the total current I of the winding. Therefore, in the system, a case in which the total current I of the winding is directly sampled by using the current detection circuit 50 can be avoided, to reduce a value of a sampled current.

When the current I2 of the second part 22 is sampled, because the current I2 of the second part 22 is lower than the total current I of the winding, compared with the case in which the total current I of the winding is directly sampled, a heat loss generated in a circuit is reduced.

A specific process of sampling the current I2 of the second part 22 by using the current detection circuit 50 is described in detail in a subsequent embodiment.

After obtaining the current I2 of the second part, the current detection circuit 50 may obtain the total current I of the winding based on the current I2 of the second part and a preset ratio. The preset ratio is a ratio of the total current I of the winding to the current I2 of the second part. The preset ratio may be obtained in advance through experiment.

A case in which the current detection circuit 50 in the current sampling system is located in the second part 22 is described above. Alternatively, the current detection circuit 50 may be located in the first part 21.

Figure 4:
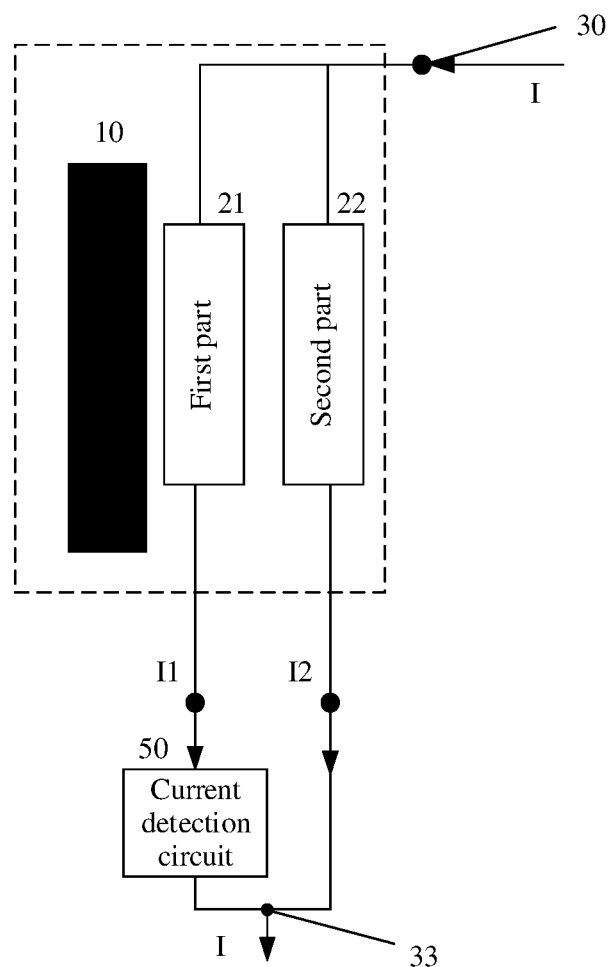
FIG. 4 is a schematic diagram of another current sampling system according to an embodiment of this application.

FIG. 4 is a schematic diagram of another current sampling system according to an embodiment of this application.

In the current sampling system, the current detection circuit 50 is located in the first part 21, a first terminal of the current detection circuit 50 is connected to the second terminal of the first part 21, and a second terminal of the current detection circuit 50 and the second terminal of the second part 22 are connected to a merged pin 33.

Similarly, in the system, a case in which the total current I of the winding is directly sampled by using the current detection circuit 50 can also be avoided, to reduce a value of a sampled current.

Therefore, the current detection circuit 50 may sample the current I1 of the first part 21, and then obtain the total current I of the winding based on the preset ratio of the total current I of the winding to the current I1 of the first part 21, or may sample the current I2 of the second part 22, and then obtain the total current I of the winding based on the preset ratio of the total current I of the winding to the current I2 of the second part 22.

In an actual operation process, to further reduce the heat loss generated in the circuit, the current detection circuit samples a smaller current in the current I1 of the first part and the current I2 of the second part. For example, with reference to FIG. 4, when the current I1 of the first part 21 is greater than the current I2 of the second part 22, the current detection circuit 50 samples the current I2 of the second part 22. Therefore, the current detection circuit may be disposed in the second part 22. When the to-be-sampled current is reduced, the heat loss generated in the circuit can be reduced.

Therefore, in the current sampling system provided in this application, the winding is split into a plurality of parts, so that the total current of the winding is a sum of currents of the parts, and the current of each part is lower than the total current of the winding. After sampling a current of any part in the parts of the winding, the current detection circuit may obtain the total current of the winding based on a ratio of the current of the part to the total current of the winding. In the current sampling system, a case in which the total current of the winding is directly sampled by using the current detection circuit can be avoided, the current detection circuit needs to sample only a current of any part of the winding, and the current of the any part is lower than the total current of the winding, so that a to-be-sampled current is reduced. Therefore, in the current sampling system, when a current of the winding is sampled, the to-be-sampled current can be reduced, to reduce a heat loss generated in a circuit.

System Embodiment 2

A winding described in this embodiment is formed by winding a Litz wire. The Litz wire is a wire formed by stranding or braiding a plurality of independently insulated wires.

The magnetic component described above may be an inductor or a transformer. In this embodiment, two cases are described. A first case is described by using an example in which the magnetic component is an inductor, and a second case is described by using an example in which the magnetic component is a transformer.

Case 1: When the magnetic component is an inductor, a winding of the inductor is formed by winding N strands of Litz wires.

Figure 5:
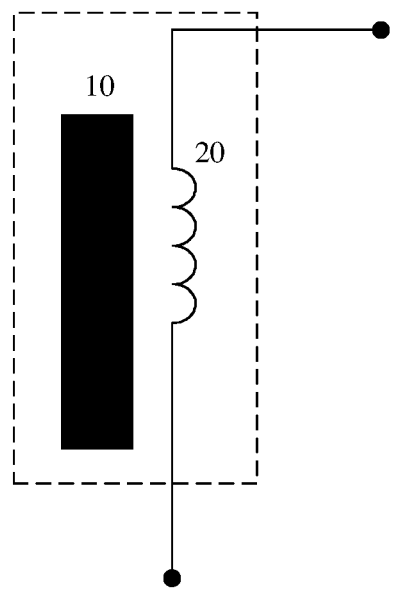
FIG. 5 is a schematic diagram of an inductor according to an embodiment of this application.

FIG. 5 is a schematic diagram of an inductor according to an embodiment of this application.

A type of the inductor is not specifically limited in this application. The inductor may include a magnetic core, or may not include a magnetic core. When the inductor does not include a magnetic core, the inductor may be an air-core inductor, and the air-core inductor does not include a magnetic core. For ease of description, the following is described in detail by using an example in which the inductor includes a magnetic core.

The inductor includes a magnetic core 10 and a winding 20. The winding 20 is formed by winding N strands of Litz wires.

When a current of the winding 20 formed by winding the N strands of Litz wires is directly sampled by using a current detection circuit, a total current flowing through the winding 20 is large, a total current of the winding that is sampled by the current detection circuit is also large, and a large heat loss is generated in a circuit. To reduce the heat loss generated in the circuit, a current directly sampled by the current detection circuit needs to be reduced. Therefore, in this application, the winding 20 formed by winding the N strands of Litz wires is split into two parts.

Figure 6:
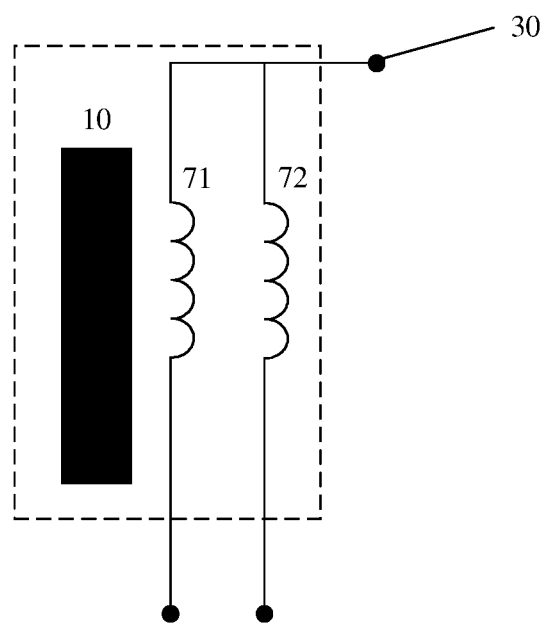
FIG. 6 is a schematic diagram of another inductor according to an embodiment of this application.

FIG. 6 is a schematic diagram of another inductor according to an embodiment of this application.

That the winding formed by winding the N strands of Litz wires is split into two parts is not specifically limited in this application. The winding may be split into more parts, for example, three parts or four parts, provided that a sum of quantities of strands of Litz wires of the parts is N. For ease of understanding by a person skilled in the art, the following is described in detail by using an example in which the winding is split into two parts.

The winding includes a first winding 71 and a second winding 72.

The first winding 71 is formed by winding N1 strands of Litz wires, and the second winding 72 is formed by winding N2 strands of Litz wires. In this case, a sum of a quantity N1 of strands of Litz wires of the first winding 71 and a quantity N2 of strands of Litz wires of the second winding 72 is N, and N is a quantity of strands of Litz wires of the winding.

Through comparison between the inductors described in FIG. 5 and FIG. 6, the two inductors have a same magnetic core, and the quantities of strands of Litz wires used in the two inductors are N. Therefore, the two inductors have a same through-current capability and a same inductance. After the winding is split into the first winding 71 and the second winding 72, performance of the inductor is not reduced.

A first terminal of the first winding 71 and a first terminal of the second winding 72 are connected to a common pin 30. A second terminal of the first winding 71 is separated from a second terminal of the second winding 72.

A total current I of the winding may be a sum of a current flowing from the common pin 30 into the first winding 71 and a current flowing from the common pin 30 into the second winding 72, or may be a sum of a current flowing out from the first winding 71 to the common pin 30 and a current flowing out from the second winding 72 to the common pin 30. Therefore, both a current of the first winding 71 and a current of the second winding 72 are lower than the total current of the winding.

Figure 7:
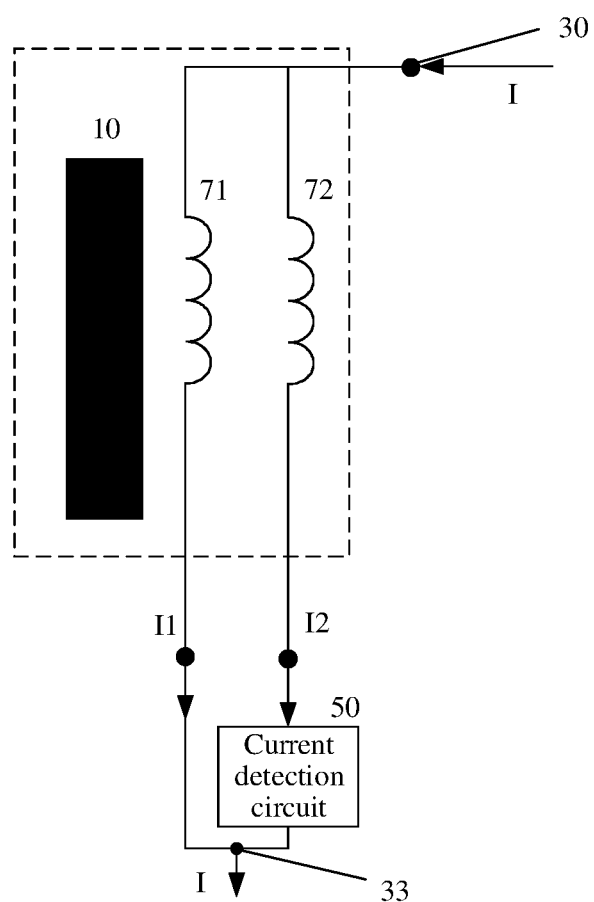
FIG. 7 is a schematic diagram of another current sampling system according to an embodiment of this application.

FIG. 7 is a schematic diagram of another current sampling system according to an embodiment of this application.

The current sampling system includes a current detection circuit 50, the first winding 71, and the second winding 72.

A first terminal of the current detection circuit 50 is connected to the second terminal of the second winding 72. A second terminal of the current detection circuit 50 and the second terminal of the first winding 71 are connected to a merged pin 33.

When a current flows from the common pin 30 into the winding, a sum of a current I1 flowing through the first winding 71 and a current I2 flowing through the second winding 72 is the total current I flowing through the winding.

The current detection circuit 50 samples the current I2 flowing through the second winding 72.

The to-be-sampled current I2 of the second winding 72 is a partial current in the total current I of the winding, and the to-be-sampled current I2 of the second winding 72 is lower than the total current I of the winding. Therefore, in the system, a case in which the total current I of the winding is directly sampled by using the current detection circuit 50 can be avoided, to reduce a value of a sampled current.

Figure 8:
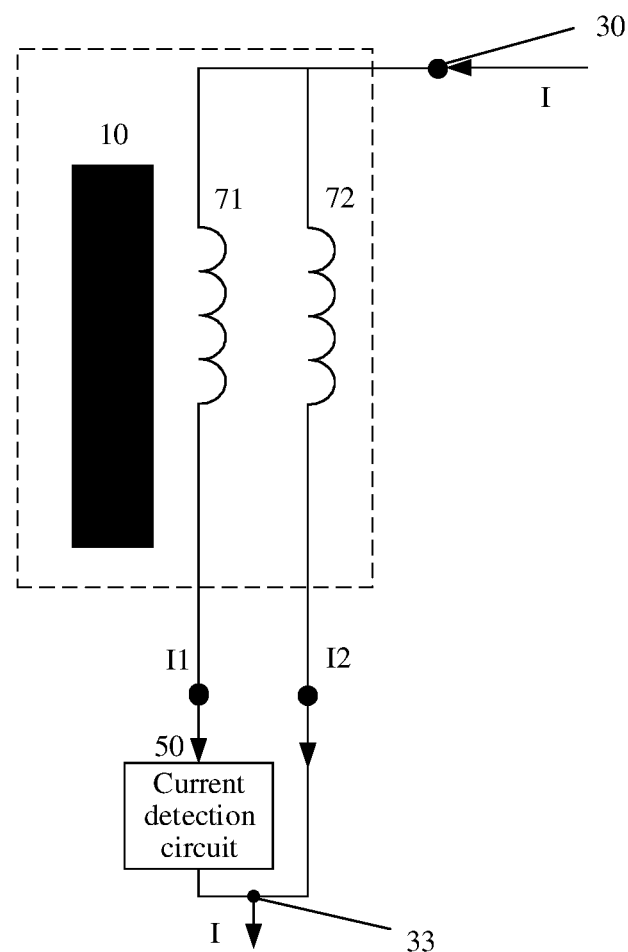
FIG. 8 is a schematic diagram of still another current sampling system according to an embodiment of this application.

FIG. 8 is a schematic diagram of still another current sampling system according to an embodiment of this application.

In the current sampling system, a first terminal of the current detection circuit 50 is connected to the second terminal of the first winding 71, and a second terminal of the current detection circuit 50 and the second terminal of the second winding are connected to a merged pin 33.

Similarly, in the system, a case in which the total current I of the winding is directly sampled by using the current detection circuit 50 can also be avoided, to reduce a value of a sampled current.

The sum of the quantity N1 of strands of Litz wires of the first winding and the quantity N2 of strands of Litz wires of the second winding is the quantity N of strands of Litz wires of the winding. Therefore, after sampling the current I1 of the first winding, the current detection circuit 50 may obtain the total current I of the winding based on a ratio of N1 to N, or after sampling the current I2 of the second winding, the current detection circuit 50 may obtain the total current I of the winding based on a ratio of N2 to N.

In an actual process of sampling a current of the magnetic component, to further reduce the heat loss generated in the circuit, the current detection circuit 50 samples only a winding with a smaller quantity of strands of Litz wires. For example, with reference to FIG. 7, when N1 is greater than N2, the quantity N1 of strands of Litz wires of the first winding 71 is greater than the quantity N2 of strands of Litz wires of the second winding 72. Therefore, the current I2 flowing through the second winding 72 is lower than the current I1 flowing through the first winding 71, and the current detection circuit 50 samples only the current I2 of the second winding 72. When the to-be-sampled current is reduced, the heat loss generated in the circuit can be reduced.

In addition, the magnetic component may be an integrated inductor, and the integrated inductor includes at least two inductors, or may include a plurality of inductors, for example, three inductors or four inductors. The inductors in the integrated inductor use a same magnetic core. For ease of understanding by a person skilled in the art, the following is described in detail by using an example in which the integrated inductor includes two inductors.

Figure 9:
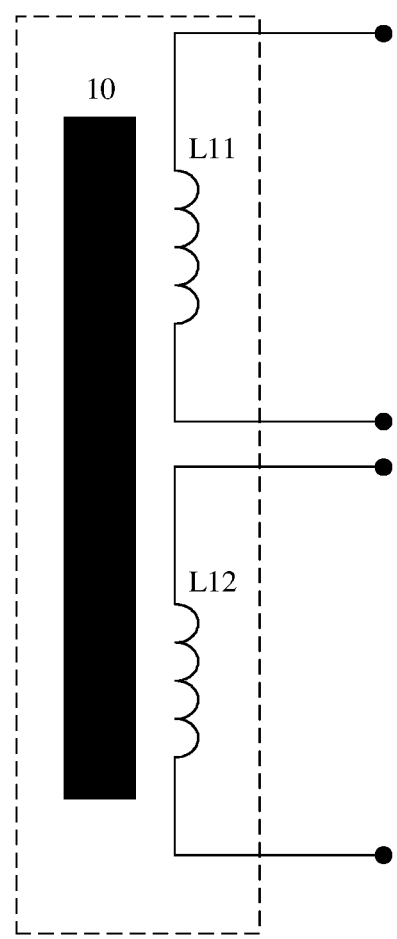
FIG. 9 is a schematic diagram of an integrated inductor according to an embodiment of this application.

FIG. 9 is a schematic diagram of an integrated inductor according to an embodiment of this application.

The integrated inductor includes a first inductor L11 and a second inductor L12.

The first inductor L11 and the second inductor L12 jointly use a same magnetic core 10.

When a current of the first inductor L11 needs to be sampled, the first inductor L11 may be split into two parts, or may be split into a plurality of parts, for example, three parts or four parts. For ease of understanding by a person skilled in the art, the following is described in detail by using an example in which the first inductor L11 is split into two parts.

Figure 10:
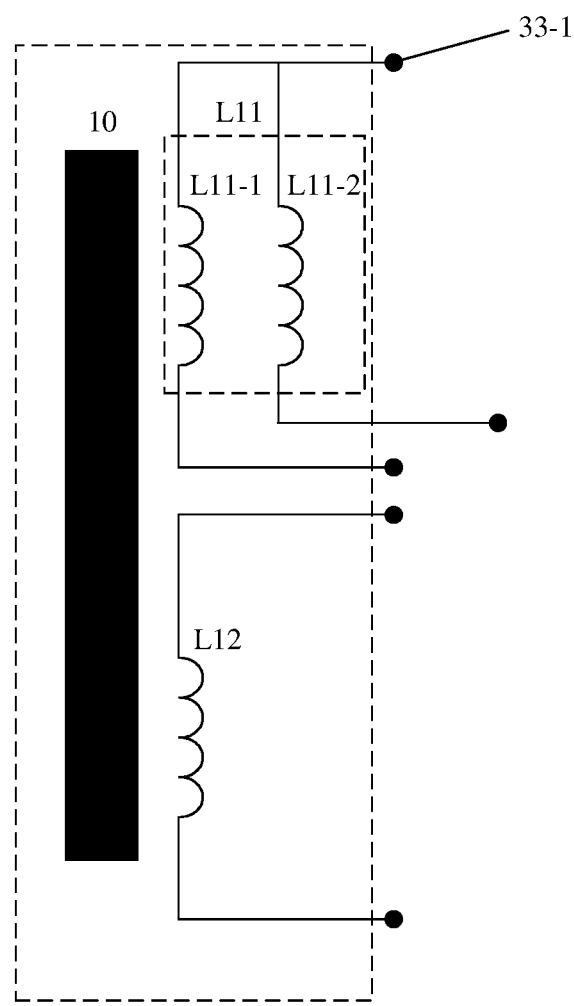
FIG. 10 is a schematic diagram of another integrated inductor according to an embodiment of this application.

FIG. 10 is a schematic diagram of another integrated inductor according to an embodiment of this application.

The first inductor L11 includes a first-inductor first winding L11-1 and a first-inductor second winding L11-2.

A first terminal of the first-inductor first winding L11-1 and a first terminal of the first-inductor second winding L11-2 are connected to a first common pin 33-1. A second terminal of the first-inductor first winding L11-1 is separated from a second terminal of the first-inductor second winding L11-2.

Similarly, when a current of the second inductor L12 needs to be sampled, the second inductor L12 may also be split into two parts.

Figure 11:
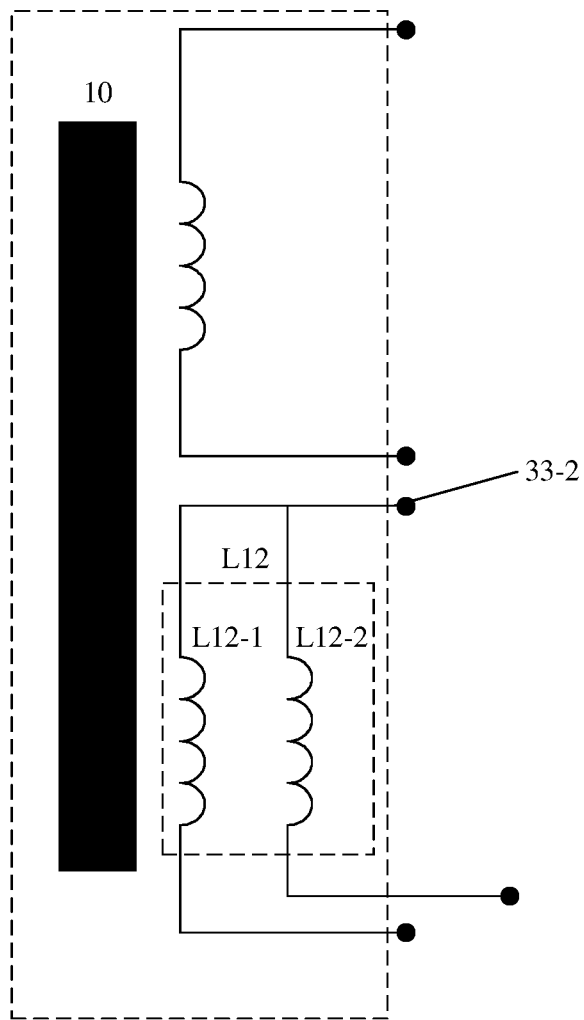
FIG. 11 is a schematic diagram of another integrated inductor according to an embodiment of this application.

FIG. 11 is a schematic diagram of another integrated inductor according to an embodiment of this application.

The second inductor L12 includes a second-inductor first winding L12-1 and a second-inductor second winding L12-2.

A first terminal of the second-inductor first winding L12-1 and a first terminal of the second-inductor second winding L12-2 are connected to a second common pin 33-2. A second terminal of the second-inductor first winding L12-1 is separated from a second terminal of the second-inductor second winding L12-2.

When both a current of the first inductor L11 and a current of the second inductor L12 need to be sampled, both the first inductor L11 and the second inductor L12 may be split into two parts.

Figure 12:
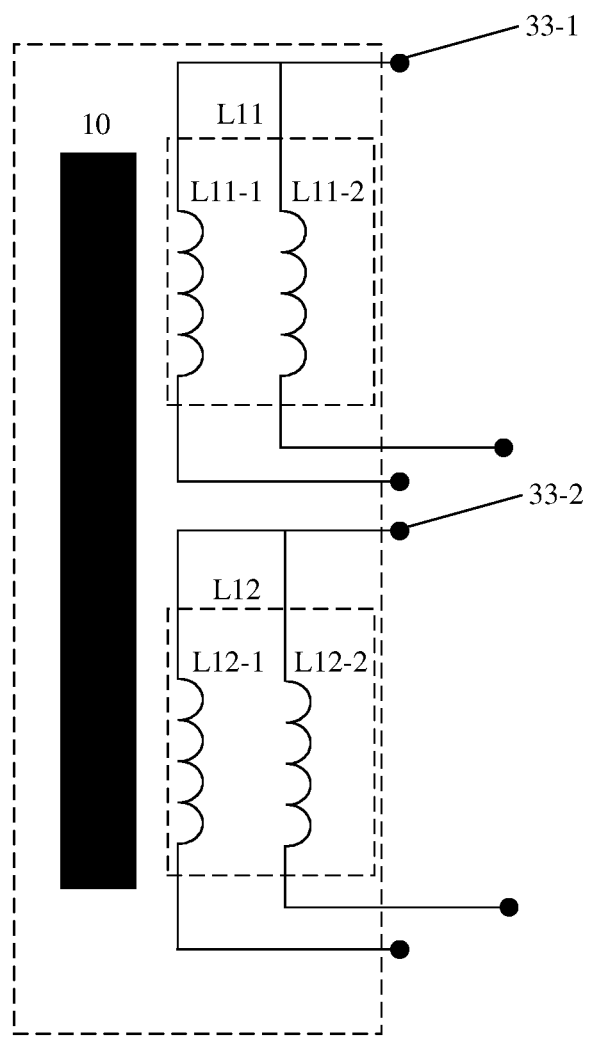
FIG. 12 is a schematic diagram of still another integrated inductor according to an embodiment of this application.

FIG. 12 is a schematic diagram of still another integrated inductor according to an embodiment of this application.

For a process of splitting the first inductor L11 and the second inductor L12, refer to FIG. 10 and FIG. 11. Details are not described herein again.

For a specific process of sampling the current of the first inductor and/or the current of the second inductor by using a current detection circuit, refer to FIG. 7 and FIG. 8. Details are not described herein again.

Case 2: When the magnetic component is a transformer, a winding is formed by winding N strands of Litz wires. The winding may be a primary-side winding of the transformer, or may be a secondary-side winding of the transformer.

Figure 13:
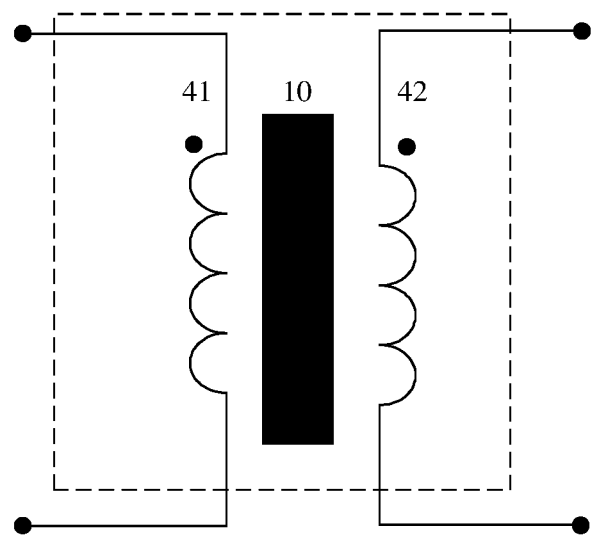
FIG. 13 is a schematic diagram of a transformer according to an embodiment of this application.

FIG. 13 is a schematic diagram of a transformer according to an embodiment of this application.

The transformer includes a magnetic core 10, a primary-side winding 41, and a secondary-side winding 42. The primary-side winding 41 is formed by winding N strands of Litz wires, and the secondary-side winding 42 is formed by winding M strands of Litz wires.

When a current of the primary-side winding 41 of the transformer needs to be sampled, and a total current of the primary-side winding 41 is directly sampled by using a current detection circuit, a total current flowing through the primary-side winding 41 is large, a total current of the primary-side winding 41 that is sampled by the current detection circuit is also large, and a large heat loss is generated in a circuit. To reduce the heat loss generated in the circuit, a current value directly sampled by the current detection circuit needs to be reduced. Therefore, in this application, the primary-side winding 41 formed by winding the N strands of Litz wires is split into two parts.

Figure 14:
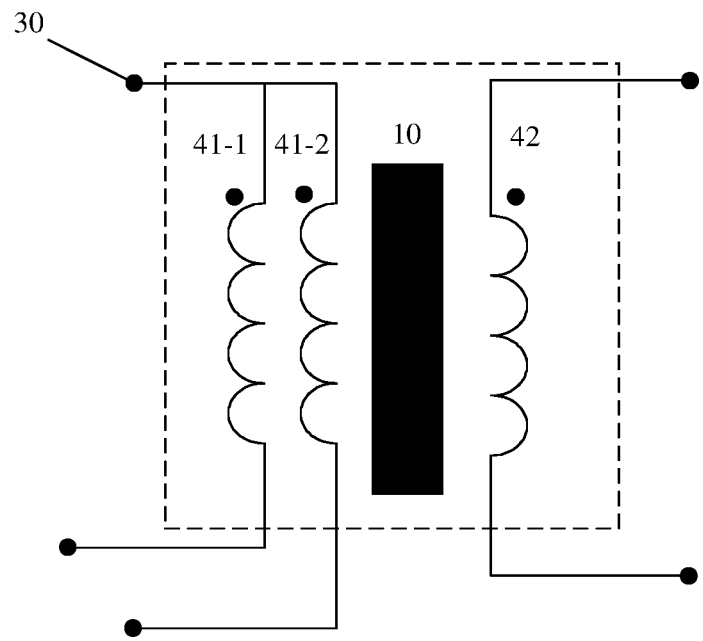
FIG. 14 is a schematic diagram of another transformer according to an embodiment of this application.

FIG. 14 is a schematic diagram of another transformer according to an embodiment of this application.

That the primary-side winding formed by winding the N strands of Litz wires is split into two parts is not specifically limited in this application. The primary-side winding may be split into more parts, for example, three parts or four parts. For ease of understanding by a person skilled in the art, the following is described in detail by using an example in which the primary-side winding is split into two parts.

The primary-side winding includes a first primary-side winding 41-1 and a second primary-side winding 41-2.

The first primary-side winding 41-1 is formed by winding N1 strands of Litz wires, and the second primary-side winding 41-2 is formed by winding N2 strands of Litz wires. In this case, a sum of a quantity N1 of strands of Litz wires of the first primary-side winding 41-1 and a quantity N2 of strands of Litz wires of the second primary-side winding 41-2 is N, and N is a quantity of strands of Litz wires of the primary-side winding.

A first terminal of the first primary-side winding 41-1 and a first terminal of the second primary-side winding 41-2 are connected to a common pin 30. A second terminal of the first primary-side winding 41-1 is separated from a second terminal of the second primary-side winding 41-2.

Because the primary-side winding is split into the first primary-side winding 41-1 and the second primary-side winding 41-2, a total current of the primary-side winding may be a sum of a current flowing from the common pin 30 into the first primary-side winding 41-1 and a current flowing from the common pin 30 into the second primary-side winding 41-2, or may be a sum of a current flowing out from the first primary-side winding 41-1 to the common pin 30 and a current flowing out from the second primary-side winding 41-2 to the common pin 30. Therefore, both a current of the first primary-side winding 41-1 and a current of the second primary-side winding 41-2 are lower than the total current of the winding.

After the primary-side winding is split into two parts, the current of the first primary-side winding 41-1 or the current of the second primary-side winding 41-2 may be sampled by using the current detection circuit. In this case, the to-be-sampled current of the first primary-side winding 41-1 is lower than the total current of the primary-side winding, and the to-be-sampled current of the second primary-side winding 41-2 is also lower than the total current of the primary-side winding. Therefore, after the primary-side winding is split into two parts, the to-be-sampled current value can be reduced, to reduce a heat loss generated in a circuit.

For a specific process of sampling the current of the first primary-side winding 41-1 and/or the current of the second primary-side winding 41-2 by using the current detection circuit, refer to FIG. 7 and FIG. 8. Details are not described herein again.

Similarly, when a current of the secondary-side winding of the transformer needs to be sampled, in this application, the secondary-side winding formed by winding the M strands of Litz wires is split into two parts.

Figure 15:
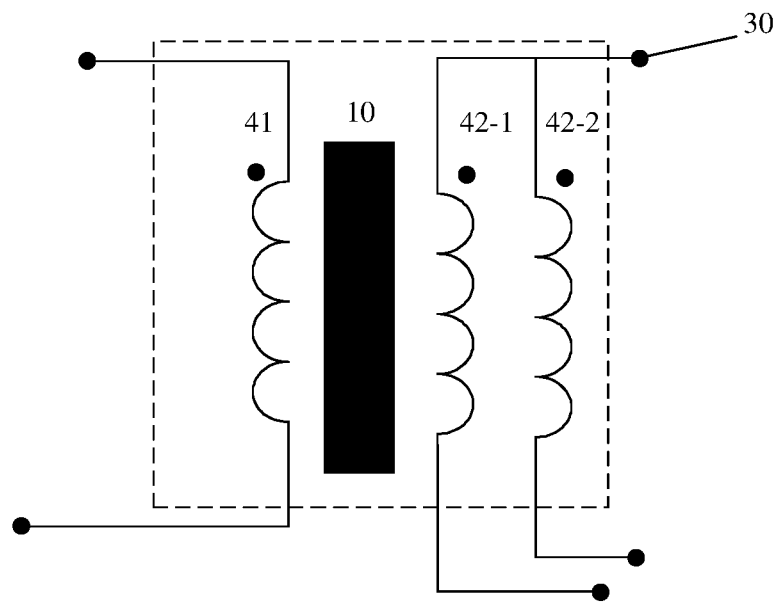
FIG. 15 is a schematic diagram of another transformer according to an embodiment of this application.

FIG. 15 is a schematic diagram of another transformer according to an embodiment of this application.

The secondary-side winding includes a first secondary-side winding 42-1 and a second secondary-side winding 42-2.

A first terminal of the first secondary-side winding 42-1 and a first terminal of the second secondary-side winding 42-2 are connected to a common pin 30. A second terminal of the first secondary-side winding 42-1 is separated from a second terminal of the second secondary-side winding 42-2.

After the secondary-side winding is split into the first secondary-side winding 42-1 and the second secondary-side winding 42-2, a current of the first secondary-side winding 42-1 and/or a current of the second secondary-side winding 42-2 are/is sampled by using the current detection circuit. For a specific process of sampling a current by using the current detection circuit, refer to FIG. 7 and FIG. 8. Details are not described herein again.

Similarly, when both a current of the primary-side winding and a current of the secondary-side winding need to be sampled, both the primary-side winding 41 and the secondary-side winding may be split into two parts.

Figure 16:
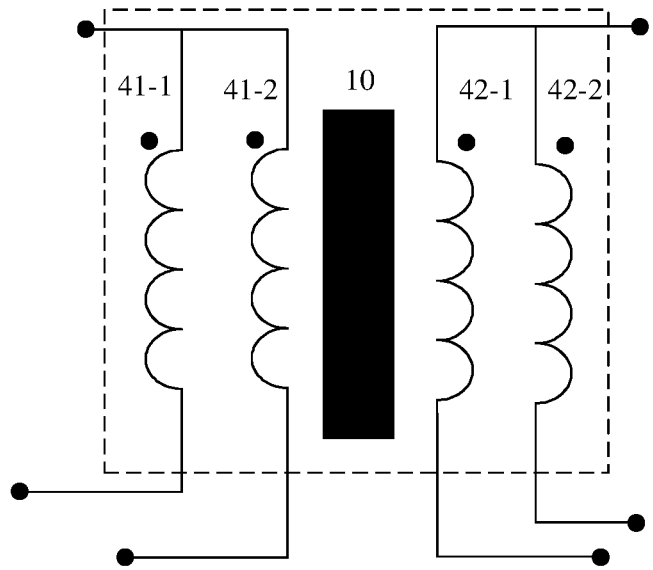
FIG. 16 is a schematic diagram of still another transformer according to an embodiment of this application.

FIG. 16 is a schematic diagram of still another transformer according to an embodiment of this application.

For a specific process of splitting both the primary-side winding and the secondary-side winding into two parts, refer to FIG. 14 and FIG. 15. For a specific process of sampling a current by using the current detection circuit, refer to FIG. 7 and FIG. 8. Details are not described herein again.

In addition, the magnetic component may be an integrated transformer, and the integrated transformer includes at least two transformers, or may include more transformers, for example, three transformers or four transformers. The transformers in the integrated transformer use a same magnetic core. For ease of understanding by a person skilled in the art, the following is described in detail by using an example in which the integrated transformer includes two transformers.

Figure 17:
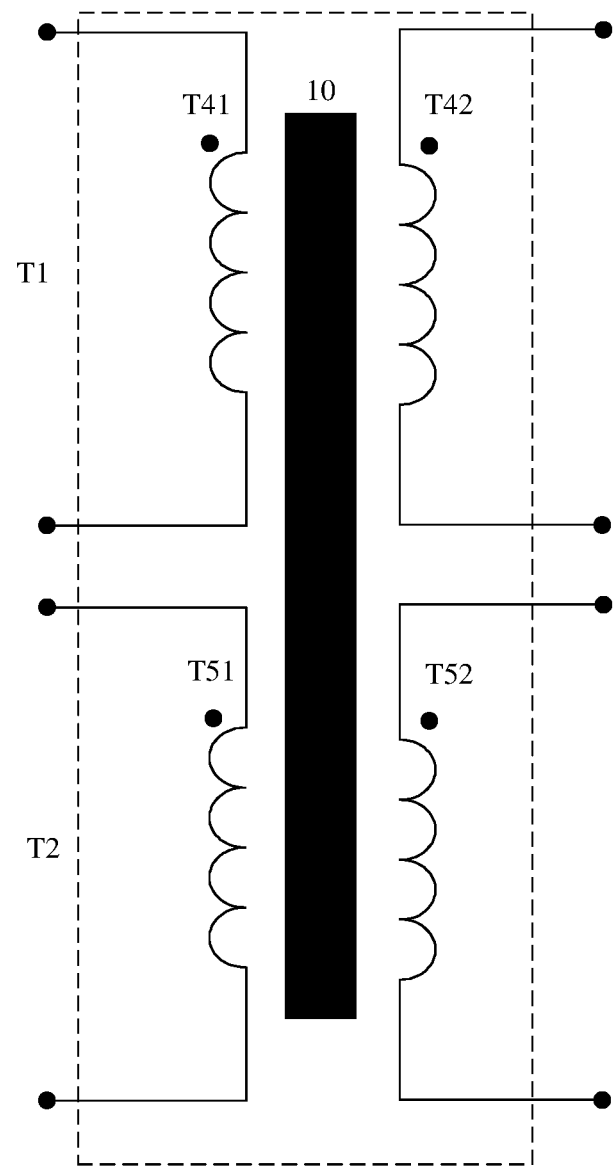
FIG. 17 is a schematic diagram of an integrated transformer according to an embodiment of this application.

FIG. 17 is a schematic diagram of an integrated transformer according to an embodiment of this application.

The integrated transformer includes a first transformer T1 and a second transformer T2.

The first transformer T1 and the second transformer T2 jointly use a same magnetic core 10.

The first transformer T1 includes a first-transformer primary-side winding T41 and a first-transformer secondary-side winding T42. The second transformer T2 includes a second-transformer primary-side winding T51 and a second-transformer secondary-side winding T52.

When a current of the first-transformer primary-side winding T41 of the first transformer T1 needs to be sampled, the first-transformer primary-side winding T41 may be split into two parts, or may be split into more parts, for example, three parts or four parts. For ease of understanding by a person skilled in the art, the following is described in detail by using an example in which the first-transformer primary-side winding T41 is split into two parts.

Figure 18:
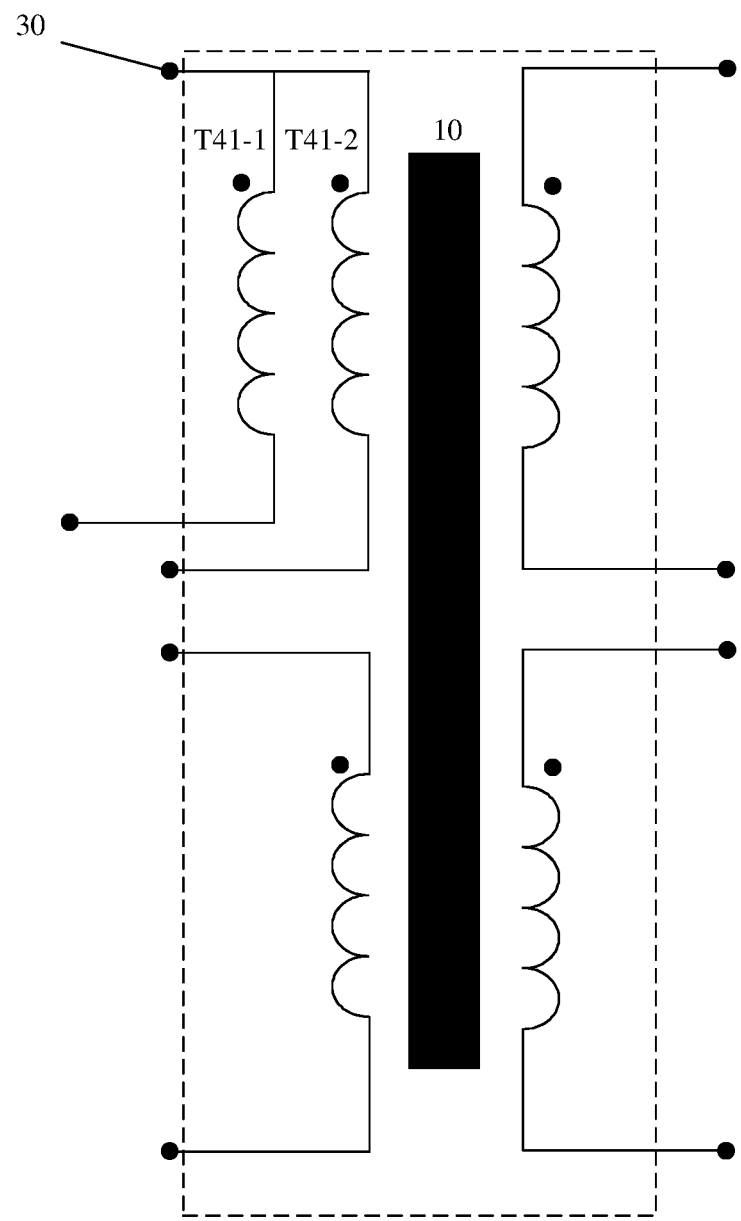
FIG. 18 is a schematic diagram of another integrated transformer according to an embodiment of this application.

FIG. 18 is a schematic diagram of another integrated transformer according to an embodiment of this application.

With reference to FIG. 17, the first-transformer primary-side winding T41 includes a first-transformer first primary-side winding T41-1 and a first-transformer second primary-side winding T41-2.

A first terminal of the first-transformer first primary-side winding T41-1 and a first terminal of the first-transformer second primary-side winding T41-2 are connected to a common pin 30. A second terminal of the first-transformer first primary-side winding T41-1 is separated from a second terminal of the first-transformer second primary-side winding T41-2.

Similarly, when a current of the first-transformer secondary-side winding T42 of the first transformer T1 needs to be sampled, the first-transformer secondary-side winding T42 may also be split into two parts.

Figure 19:
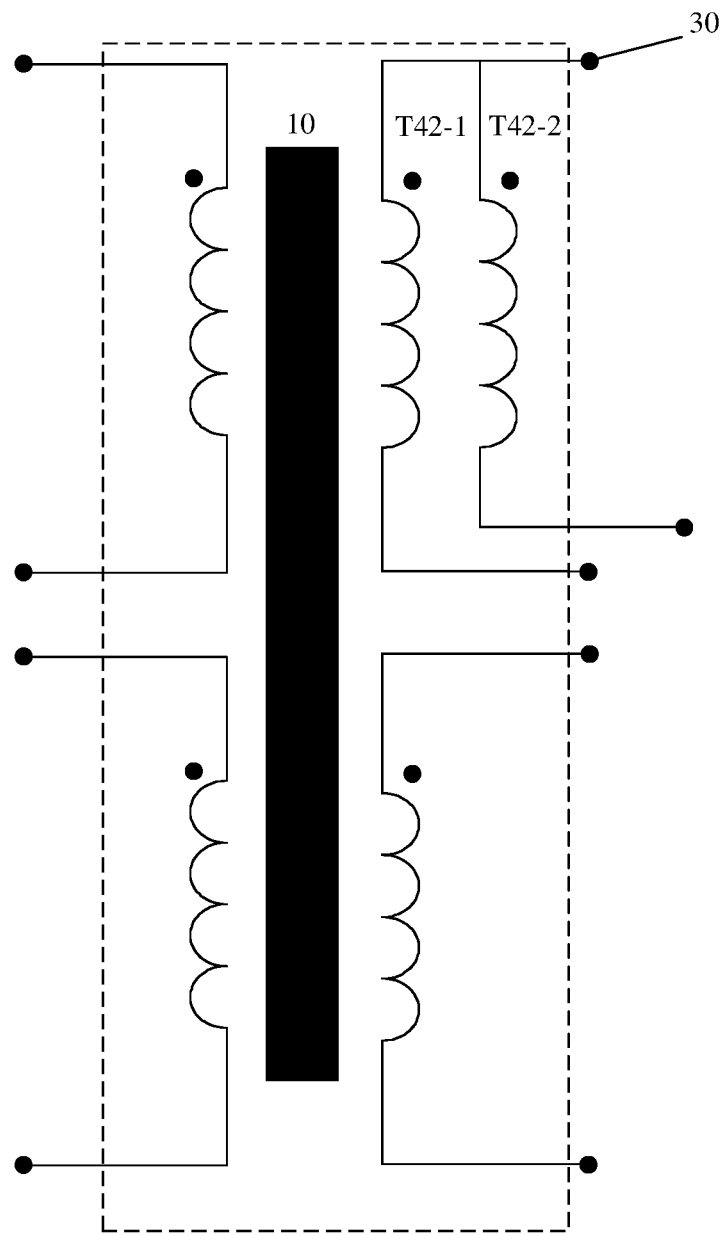
FIG. 19 is a schematic diagram of another integrated transformer according to an embodiment of this application.

FIG. 19 is a schematic diagram of another integrated transformer according to an embodiment of this application.

With reference to FIG. 17, the first-transformer secondary-side winding T42 includes a first-transformer first secondary-side winding T42-1 and a first-transformer second secondary-side winding T42-2.

A first terminal of the first-transformer first secondary-side winding T42-1 and a first terminal of the first-transformer second secondary-side winding T42-2 are connected to a common pin 30. A second terminal of the first-transformer first secondary-side winding T42-1 is separated from a second terminal of the first-transformer second secondary-side winding T42-2.

When both a current of the first-transformer first primary-side winding T41-1 and a current of the first-transformer second primary-side winding T41-2 of the first transformer T1 need to be sampled, both the first-transformer first primary-side winding T41-1 and the first-transformer second primary-side winding T41-2 may be split into two parts.

Figure 20:
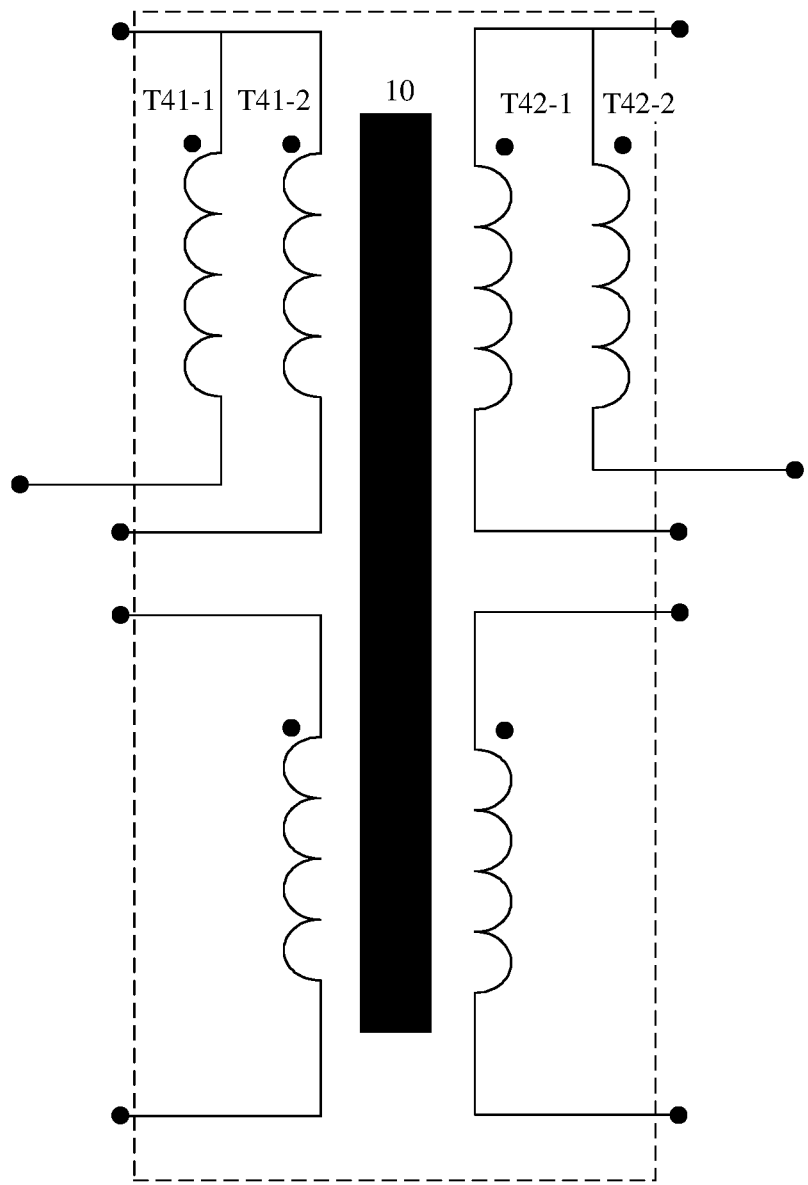
FIG. 20 is a schematic diagram of still another integrated transformer according to an embodiment of this application.

FIG. 20 is a schematic diagram of still another integrated transformer according to With reference to FIG. 17, for a specific process of splitting the first-transformer primary-side winding T41 and the first-transformer secondary-side winding T42, refer to FIG. 18 and FIG. 19. Details are not described herein again.

When a current of the second-transformer primary-side winding T51 of the second transformer T2 needs to be sampled, the second-transformer primary-side winding T51 may be split into two parts.

Figure 21:
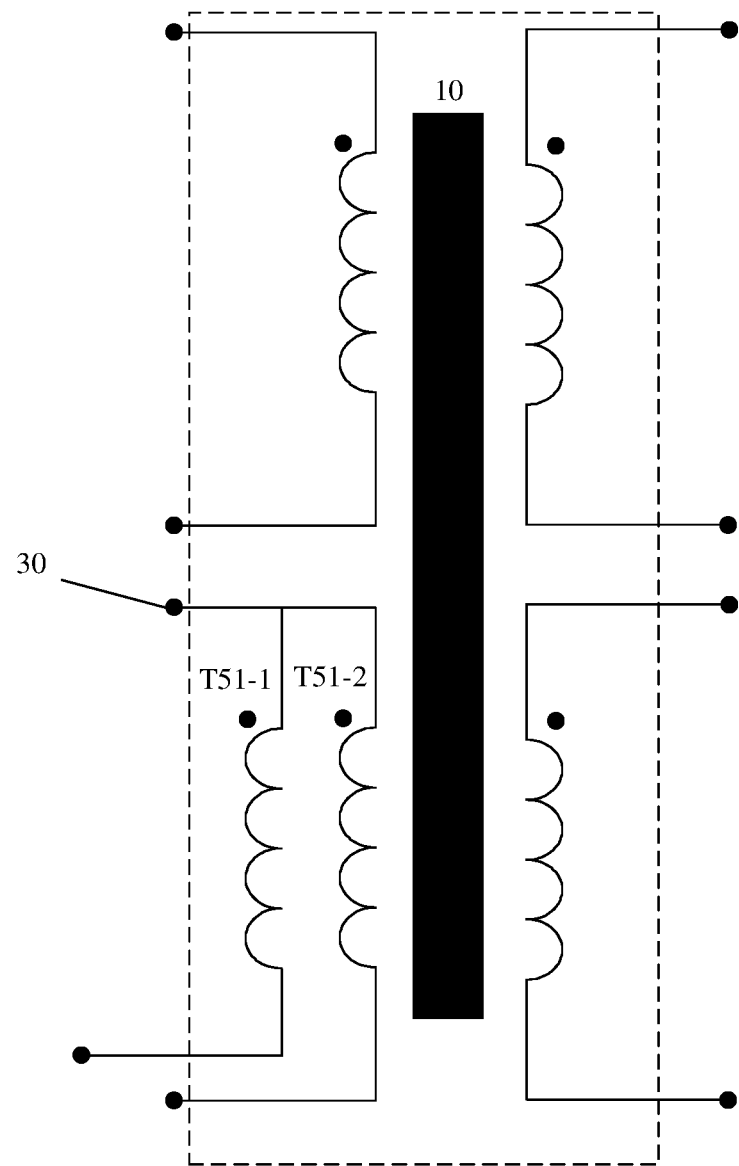
FIG. 21 is a schematic diagram of yet another integrated transformer according to an embodiment of this application.

FIG. 21 is a schematic diagram of yet another integrated transformer according to an embodiment of this application.

With reference to FIG. 17, the second-transformer primary-side winding T51 includes a second-transformer first primary-side winding T51-1 and a second-transformer second primary-side winding T51-2.

A first terminal of the second-transformer first primary-side winding T51-1 and a first terminal of the second-transformer second primary-side winding T51-2 are connected to a common pin 30. A second terminal of the second-transformer first primary-side winding T51-1 is separated from a second terminal of the second-transformer second primary-side winding T51-2.

Similarly, when a current of the second-transformer secondary-side winding T52 of the second transformer T2 needs to be sampled, the second-transformer secondary-side winding T52 may also be split into two parts.

Figure 22:
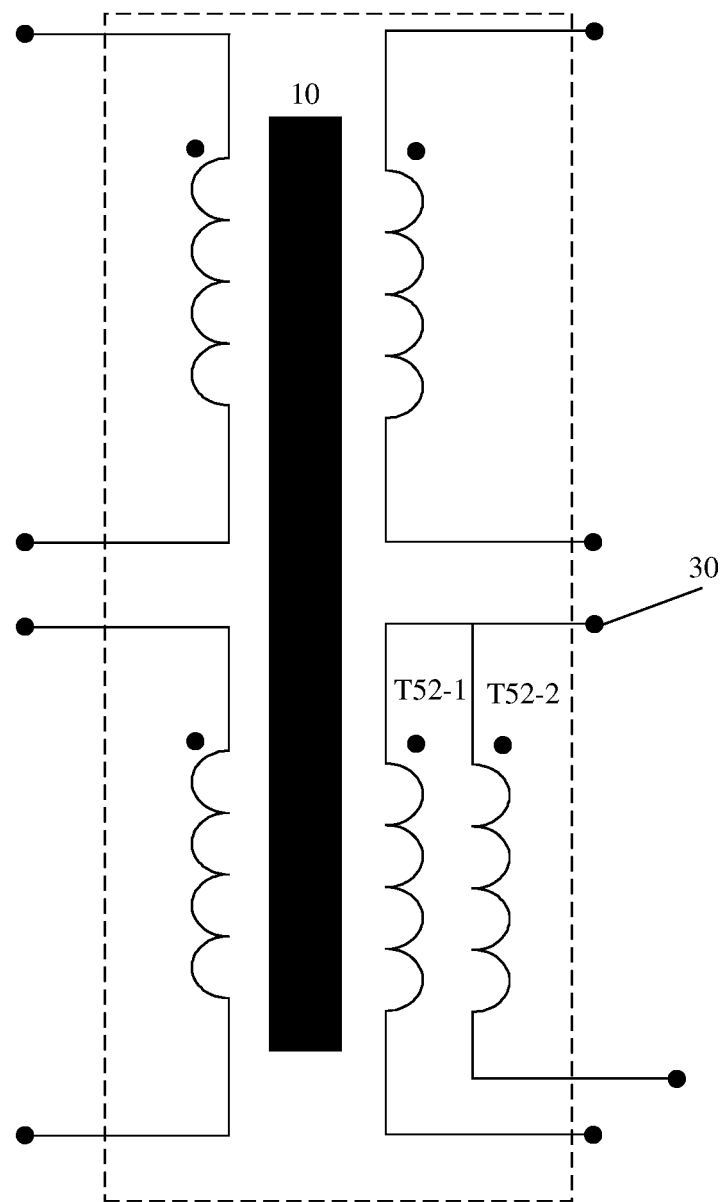
FIG. 22 is a schematic diagram of still yet another integrated transformer according to an embodiment of this application.

FIG. 22 is a schematic diagram of still yet another integrated transformer according to an embodiment of this application.

With reference to FIG. 17, the second-transformer secondary-side winding T52 includes a second-transformer first secondary-side winding T52-1 and a second-transformer second secondary-side winding T52-2.

A first terminal of the second-transformer first secondary-side winding T52-1 and a first terminal of the second-transformer second secondary-side winding T52-2 are connected to a common pin 30. A second terminal of the second-transformer first secondary-side winding T52-1 is separated from a second terminal of the second-transformer second secondary-side winding T52-2.

When both a current of the second-transformer primary-side winding T51 and a current of the second-transformer secondary-side winding T52 of the second transformer T2 need to be sampled, both the second-transformer primary-side winding T51 and the second-transformer secondary-side winding T52 may be split into two parts.

Figure 23:
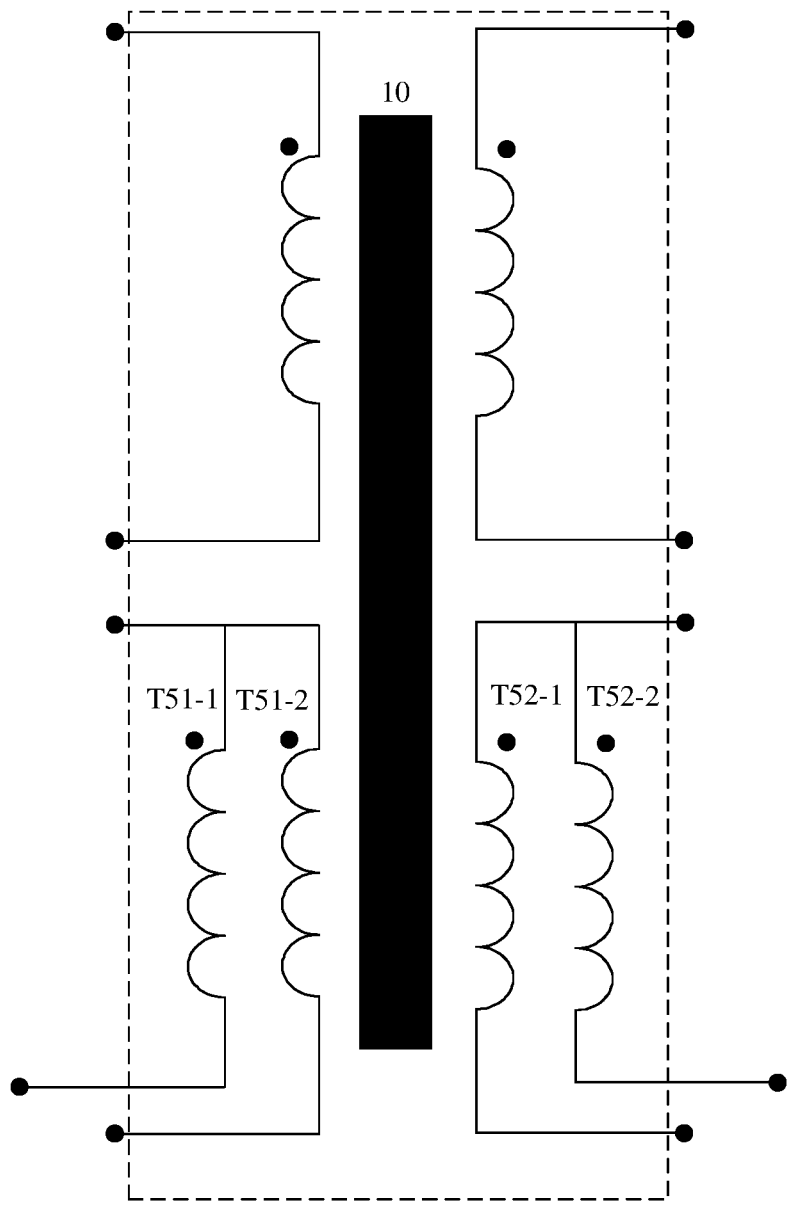
FIG. 23 is a schematic diagram of another integrated transformer according to an embodiment of this application.

FIG. 23 is a schematic diagram of another integrated transformer according to an embodiment of this application.

With reference to FIG. 17, for a specific process of splitting both the second-transformer primary-side winding T51 and the second-transformer secondary-side winding T52 into two parts, refer to FIG. 21 and FIG. 22. Details are not described herein again.

In addition, when all of a current of the first-transformer primary-side winding, a current of the first-transformer secondary-side winding, a current of the second-transformer primary-side winding, and a current of the second-transformer secondary-side winding of the integrated transformer need to be sampled, all of the first-transformer primary-side winding, the first-transformer secondary-side winding, the second-transformer primary-side winding, and the second-transformer secondary-side winding may be split into two parts.

Figure 24:
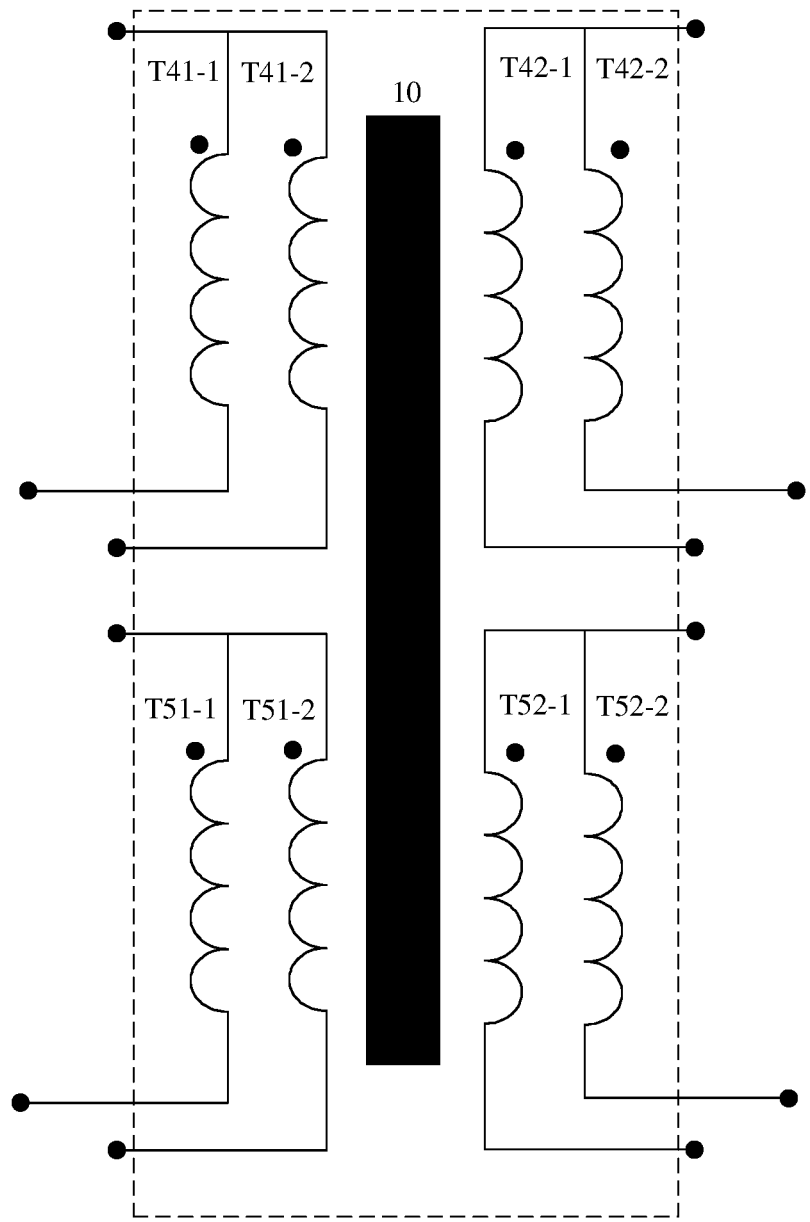
FIG. 24 is a schematic diagram of still another integrated transformer according to an embodiment of this application.

FIG. 24 is a schematic diagram of still another integrated transformer according to With reference to FIG. 17, for a specific process of splitting all of the first-transformer primary-side winding T41, the first-transformer secondary-side winding T42, the second-transformer primary-side winding T51, and the second-transformer secondary-side winding T52 into two parts, refer to FIG. 18 to FIG. 23. Details are not described herein again.

For a specific process of sampling a current of a winding after splitting by using the current detection circuit, refer to FIG. 7 and FIG. 8. Details are not described herein again.

In this application, the quantities N1, N2, N, and M of strands of Litz wires of the windings described above are all positive integers.

System Embodiment 3

The winding described in the foregoing embodiment is formed by winding the Litz wire, and a winding described below is a printed circuit board (PCB) winding.

The magnetic component described above may be an inductor or a transformer. In this embodiment, two cases are described. A first case is described by using an example in which the magnetic component is an inductor, and a second case is described by using an example in which the magnetic component is a transformer.

Case 1: When the magnetic component is an inductor, a winding of the inductor is a PCB winding.

A type of the inductor is not specifically limited in this application. The inductor may include a magnetic core, or may not include a magnetic core. When the inductor does not include a magnetic core, the inductor may be an air-core inductor, and the air-core inductor does not include a magnetic core. For ease of description, the following is described in detail by using an example in which the inductor includes a magnetic core.

When a current of the PCB winding is directly sampled by using a current detection circuit, a total current flowing through the PCB winding is large, a total current of the PCB winding that is sampled by the current detection circuit is also large, and a large heat loss is generated in a circuit. To reduce the heat loss generated in the circuit, a current directly sampled by the current detection circuit needs to be reduced. Therefore, in this application, the PCB winding is split into two parts.

Figure 25:
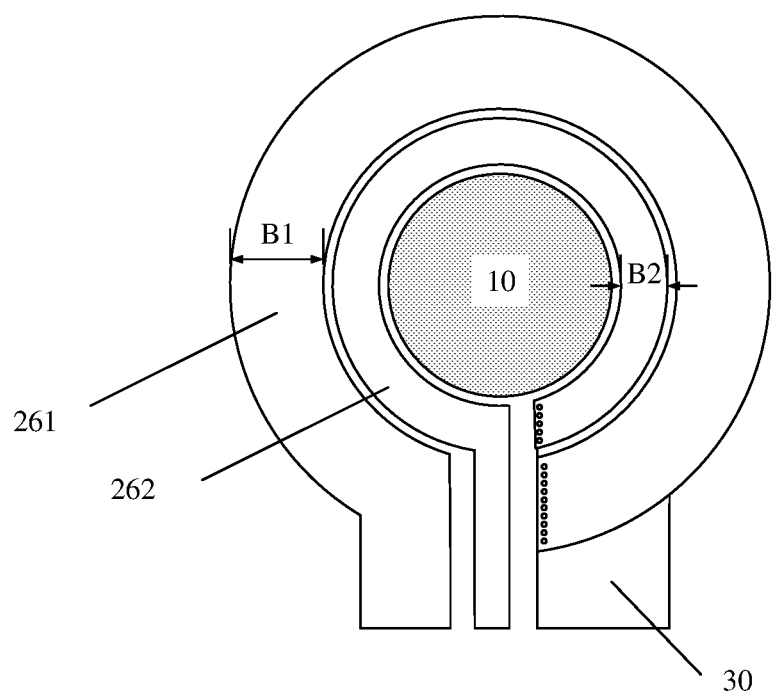
FIG. 25 is a circuit diagram of a PCB winding according to an embodiment of this application.

FIG. 25 is a circuit diagram of a PCB winding according to this application.

That the PCB winding is split into two parts is not specifically limited in this application. The PCB winding may be split into more parts, for example, three parts or four parts, provided that a sum of widths of the parts is a total width of the PCB winding.

The PCB winding includes a magnetic core 10, a first winding 261, and a second winding 262.

A first terminal of the first winding 261 and a first terminal of the second winding 262 are connected to a common pin 30. A second terminal of the first winding 261 is separated from a second terminal of the second winding 262.

Figure 26:
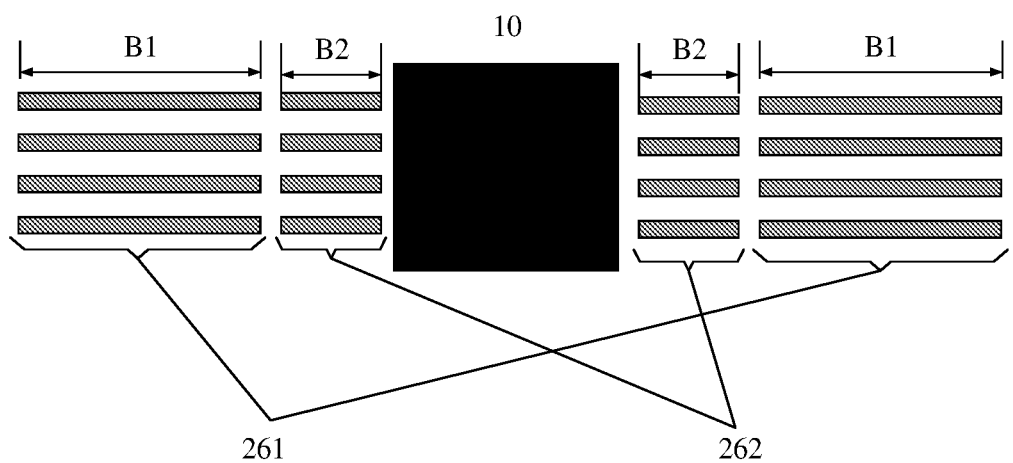
FIG. 26 is a circuit diagram of another PCB winding according to an embodiment of this application.

FIG. 26 is a circuit diagram of another PCB winding according to this application.

With reference to FIG. 25, a width of the first winding 261 is B1, a width of the second winding 262 is B2, and a sum of the width B1 of the first winding 261 and the width B2 of the second winding 262 is B.

After the PCB winding is split into two parts, the total width B of the PCB winding is not changed, and the magnetic core 10 is not changed. Therefore, an inductor formed by the PCB winding after splitting has a same through-current capability and a same inductance as an inductor formed by the PCB winding before splitting, and original performance of the inductor is not reduced.

A total current of the PCB winding may be a sum of a current flowing from the common pin 30 into the first winding 261 and a current flowing from the common pin 30 into the second winding 262, or may be a sum of a current flowing out from the first winding 261 to the common pin and a current flowing out from the second winding 262 to the common pin. Therefore, both a current of the first winding 261 and a current of the second winding 262 are lower than the total current of the winding.

Figure 27:
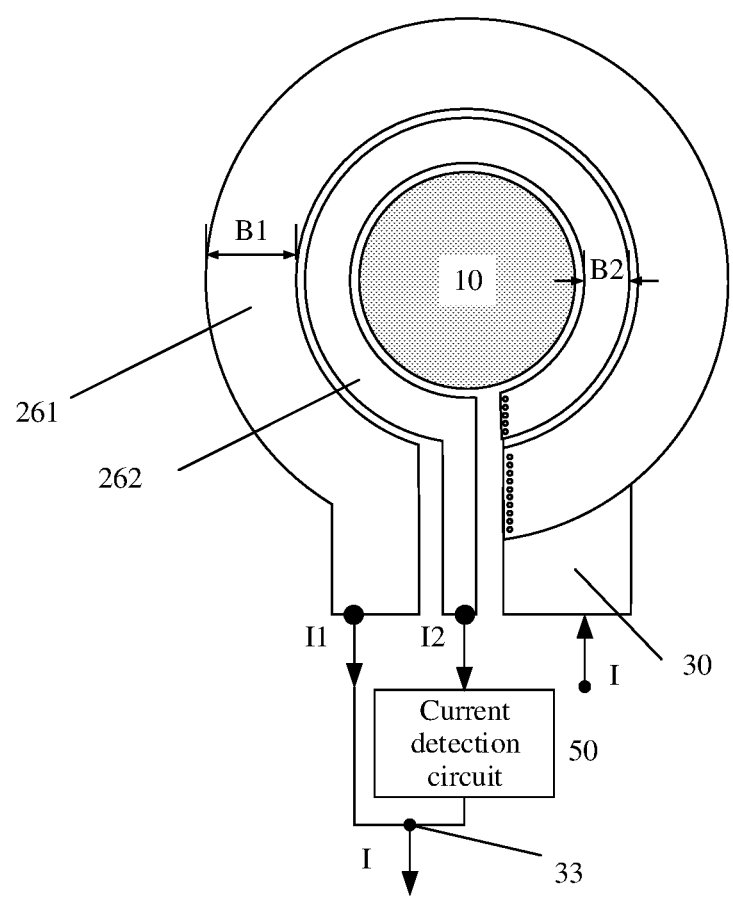
FIG. 27 is a schematic diagram of still another current sampling system according to an embodiment of this application.

FIG. 27 is a schematic diagram of still another current sampling system according to an embodiment of this application.

The current sampling system includes a current detection circuit 50, the first winding 261, and the second winding 262.

A first terminal of the current detection circuit 50 is connected to the second terminal of the second winding 262. A second terminal of the current detection circuit 50 and the second terminal of the first winding 261 are connected to a merged pin 33.

After the current I2 of the second winding 262 is sampled by using the current detection circuit 50, the total current I of the PCB winding may be obtained based on a preset ratio. The preset ratio may be a ratio of the total width B of the PCB winding to the width B2 of the second winding. In addition, the preset ratio may be obtained in advance through experiment.

When a current flows from the common pin 30 into the winding, a sum of a current flowing through the first winding 261 and a current flowing through the second winding 262 is the total current flowing through the winding.

After the PCB winding is split into two parts, when a current of either of the two parts is sampled by using the current detection circuit, the current is lower than the directly sampled total current of the PCB winding. Therefore, a value of a directly sampled current is reduced.

In an actual process of sampling a current of the magnetic component, to further reduce the heat loss generated in the circuit, the current detection circuit samples only a winding with a smaller width. For example, with reference to FIG. 26, when B1 is greater than B2, the width B1 of the first winding is greater than the width B2 of the second winding. Therefore, the current flowing through the second winding 262 is lower than the current flowing through the first winding 261, and the current detection circuit 50 samples only the current of the second winding 262. When the to-be-sampled current is reduced, the heat loss generated in the circuit can be reduced.

In addition, the magnetic component may be an integrated inductor, and the integrated inductor includes at least two inductors, or may include a plurality of inductors, for example, three inductors or four inductors. The inductors in the integrated inductor use a same magnetic core. For ease of understanding by a person skilled in the art, the following is described in detail by using an example in which the integrated inductor includes two inductors.

When the magnetic component is an integrated inductor, a winding of an inductor in the integrated inductor is a PCB winding.

Figure 28:
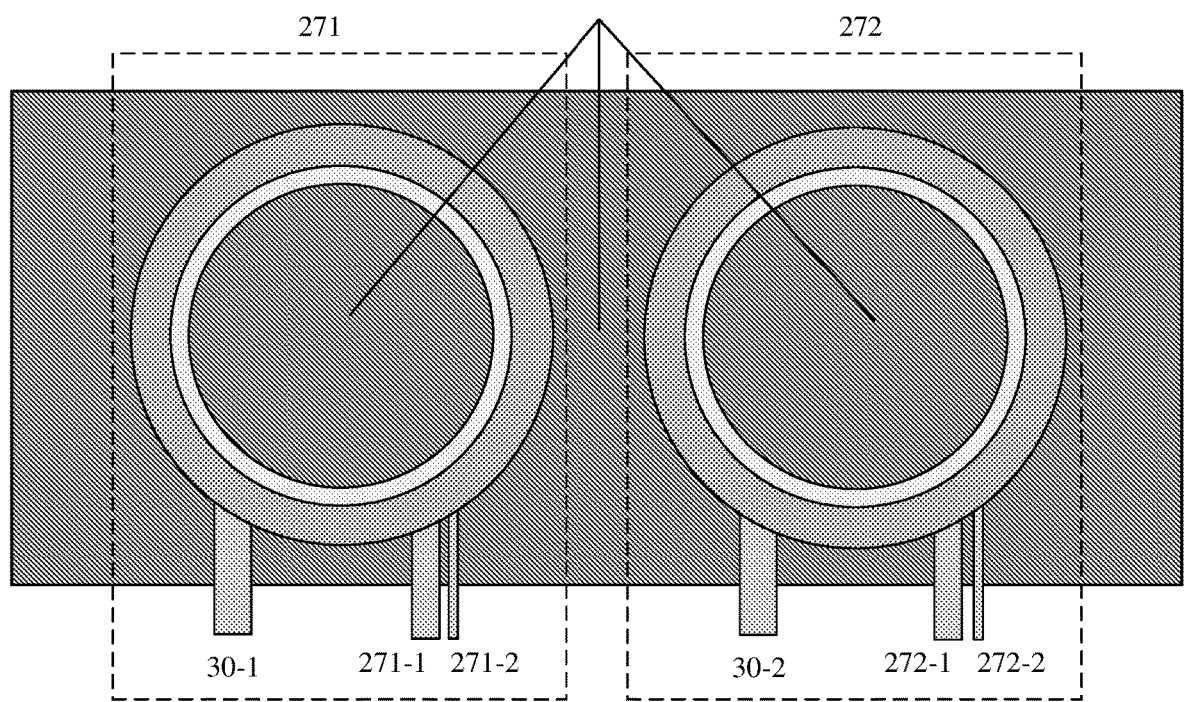
FIG. 28 is a schematic diagram of an integrated inductor according to an embodiment of this application.

FIG. 28 is a schematic diagram of an integrated inductor according to an embodiment of this application.

The integrated inductor includes a magnetic core 10, a first inductor 271, and a second inductor 272.

Both a winding of the first inductor 271 and a winding of the second inductor 272 are PCB windings.

When a current of the first inductor 271 needs to be sampled, the winding of the first inductor 271 is split. When a current of the second inductor 272 needs to be sampled, the winding of the second inductor 272 is split. When both a current of the first winding 271 and a current of the second winding 272 need to be sampled, both the winding of the first inductor 271 and the winding of the second inductor 272 are split.

When only a current of the first inductor 271 or a current of the second inductor 272 needs to be sampled, references may be made to FIG. 25. Details are not described herein again. The following describes a difference between sampling of a current of a winding in an integrated inductor and sampling of a current of a winding in an inductor.

For ease of understanding by a person skilled in the art, the following is described in detail by using an example in which both the winding of the first inductor 271 and the winding of the second inductor 272 are split.

The first inductor 271 includes a first-inductor first winding 271-1 and a first-inductor second winding 271-2. The second inductor includes a second-inductor first winding 272-1 and a second-inductor second winding 272-2.

A first terminal of the first-inductor first winding 271-1 and a first terminal of the first-inductor second winding 271-2 are connected to a common pin 30-1. A second terminal of the first-inductor first winding 271-1 is separated from a second terminal of the first-inductor second winding 271-2.

A first terminal of the second-inductor first winding 272-1 and a first terminal of the second-inductor second winding 272-2 are connected to a common pin 30-2. A second terminal of the second-inductor first winding 272-1 is separated from a second terminal of the second-inductor second winding 272-2.

After the winding of the first inductor 271 and the winding of the second inductor 272 are split, a current of a winding after splitting may be sampled. For example, after the winding of the first inductor 272 is split into the first-inductor first winding 271-1 and the first-inductor second winding 271-2, a sum of a width of the first-inductor first winding 271-1 and a width of the first-inductor second winding 271-2 is a total width of the winding of the first inductor 272, and a sum of a current flowing through the first-inductor first winding 271-1 and a current of the first-inductor second winding 271-2 is a total current flowing through the winding of the first inductor 271. Therefore, both the current flowing through the first-inductor first winding 271-1 and the current of the first-inductor second winding 271-2 are lower than the total current flowing through the winding of the first inductor 271. Therefore, when the current of the first-inductor first winding 271-1 or the current of the first-inductor second winding 271-2 is sampled by using the current detection circuit, a sampled current value is low.

In an actual operation process, to further reduce the heat loss generated in the circuit, only a winding with a smaller width in the first-inductor first winding 271-1 and the first-inductor second winding 271-2 is sampled by using the current detection circuit, that is, only a winding with a lower current value is sampled by using the current detection circuit.

A process of sampling the current of the second inductor 272 is similar to the foregoing process, and details are not described herein again. For a specific process of sampling a current of a winding by using the current detection circuit, refer to FIG. 27. Details are not described herein again.

Case 2: When the magnetic component is a transformer, both a primary-side winding and a secondary-side winding of the transformer are PCB windings.

Figure 29:
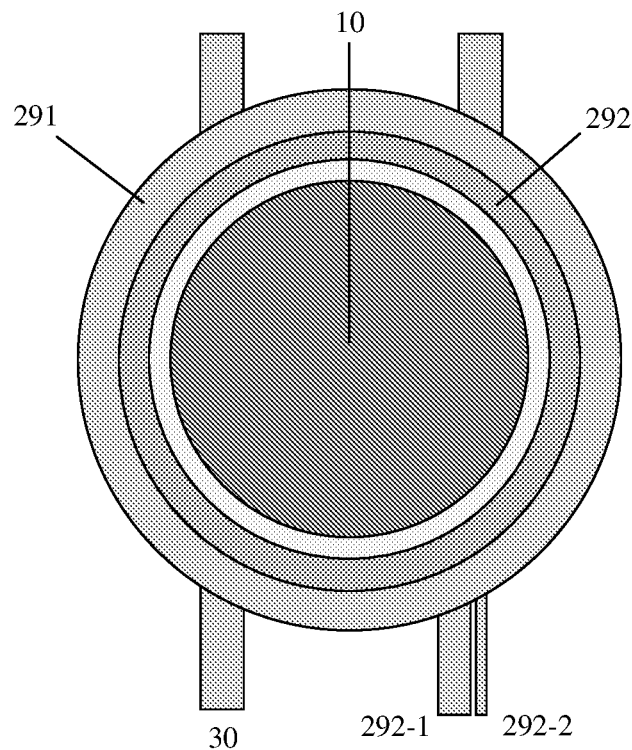
FIG. 29 is a schematic diagram of a transformer according to an embodiment of this application.

FIG. 29 is a schematic diagram of a transformer according to an embodiment of this application.

The transformer includes a magnetic core 10, a primary-side winding 291, and a secondary-side winding 292.

When a current of the secondary-side winding 292 of the transformer needs to be sampled, and a total current of the secondary-side winding 292 is directly sampled by using a current detection circuit, a total current flowing through the secondary-side winding 292 is large, a total current of the secondary-side winding 292 that is sampled by the current detection circuit is also large, and a large heat loss is generated in a circuit. To reduce the heat loss generated in the circuit, a current value directly sampled by the current detection circuit needs to be reduced. Therefore, in this application, the secondary-side winding 292 is split into two parts, so that a sum of widths of the two parts is a total width of the secondary-side winding 292.

The secondary-side winding 292 includes a first secondary-side winding 292-1 and a second secondary-side winding 292-2.

A sum of a width of the first secondary-side winding 292-1 and a width of the second secondary-side winding 292-2 is the total width of the secondary-side winding 292.

A first terminal of the first secondary-side winding 292-1 and a first terminal of the second secondary-side winding 292-2 are connected to a common pin 30. A second terminal of the first secondary-side winding 292-1 is separated from a second terminal of the second secondary-side winding 292-2.

Similarly, when a current of the primary-side winding 291 needs to be detected, the primary-side winding 291 is split into two parts in this application.

Figure 30:
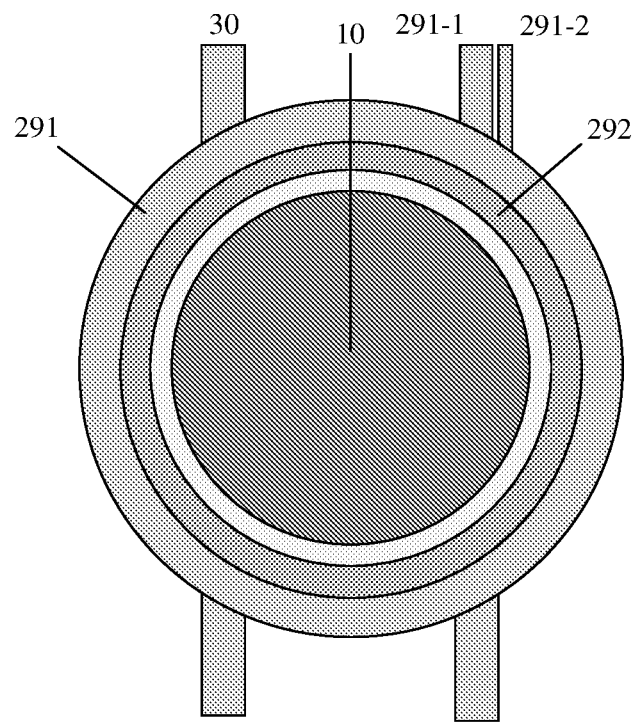
FIG. 30 is a schematic diagram of another transformer according to an embodiment of this application.

FIG. 30 is a schematic diagram of another transformer according to an embodiment of this application.

The primary-side winding 291 includes a first primary-side winding 291-1 and a second primary-side winding 291-2.

A first terminal of the first primary-side winding 291-1 and a first terminal of the second primary-side winding 291-2 are connected to a common pin 30. A second terminal of the first primary-side winding 291-1 is separated from a second terminal of the second primary-side winding 291-2.

In addition, when both a current of the primary-side winding and a current of the secondary-side winding need to be detected, both the primary-side winding and the secondary-side winding may be split into two parts.

Figure 31:
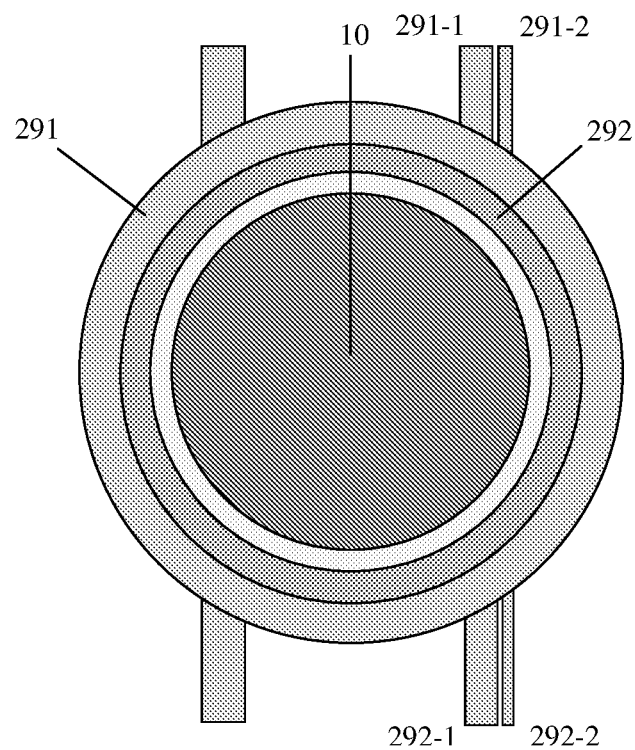
FIG. 31 is a schematic diagram of another transformer according to an embodiment of this application.

FIG. 31 is a schematic diagram of another transformer according to an embodiment of this application.

For a specific process of splitting the primary-side winding and the secondary-side winding into two parts, refer to FIG. 29 and FIG. 30. For a specific process of sampling a current of a winding by using the current detection circuit, refer to FIG. 27. Details are not described herein again.

In addition, the magnetic component may be an integrated transformer, and the integrated transformer includes at least two transformers, or may include more transformers, for example, three transformers or four transformers. The transformers in the integrated transformer use a same magnetic core. For ease of understanding by a person skilled in the art, the following is described in detail by using an example in which the integrated transformer includes two transformers.

Figure 32:
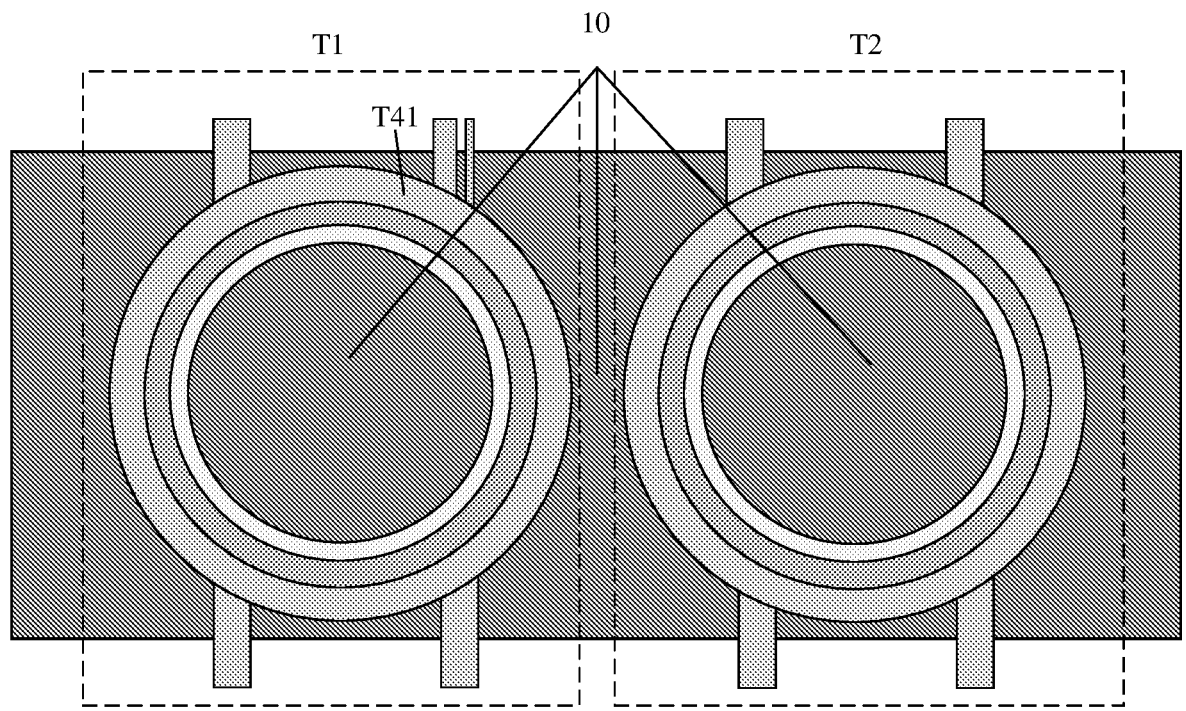
FIG. 32 is a schematic diagram of an integrated transformer according to an embodiment of this application.

FIG. 32 is a schematic diagram of an integrated transformer according to an embodiment of this application.

The integrated transformer includes a first transformer T1 and a second transformer T2.

The first transformer T1 and the second transformer T2 jointly use a same magnetic core 10.

When a current of a first-transformer primary-side winding T41 of the first transformer T1 needs to be sampled, the first-transformer primary-side winding T41 may be split into two parts, or may be split into more parts, for example, three parts or four parts. For ease of understanding by a person skilled in the art, the following is described in detail by using an example in which the first-transformer primary-side winding T41 is split into two parts.

For a specific process in which the first-transformer primary-side winding T41 is split into two parts, refer to FIG. 29 and FIG. 30. Details are not described herein again.

Figure 33:
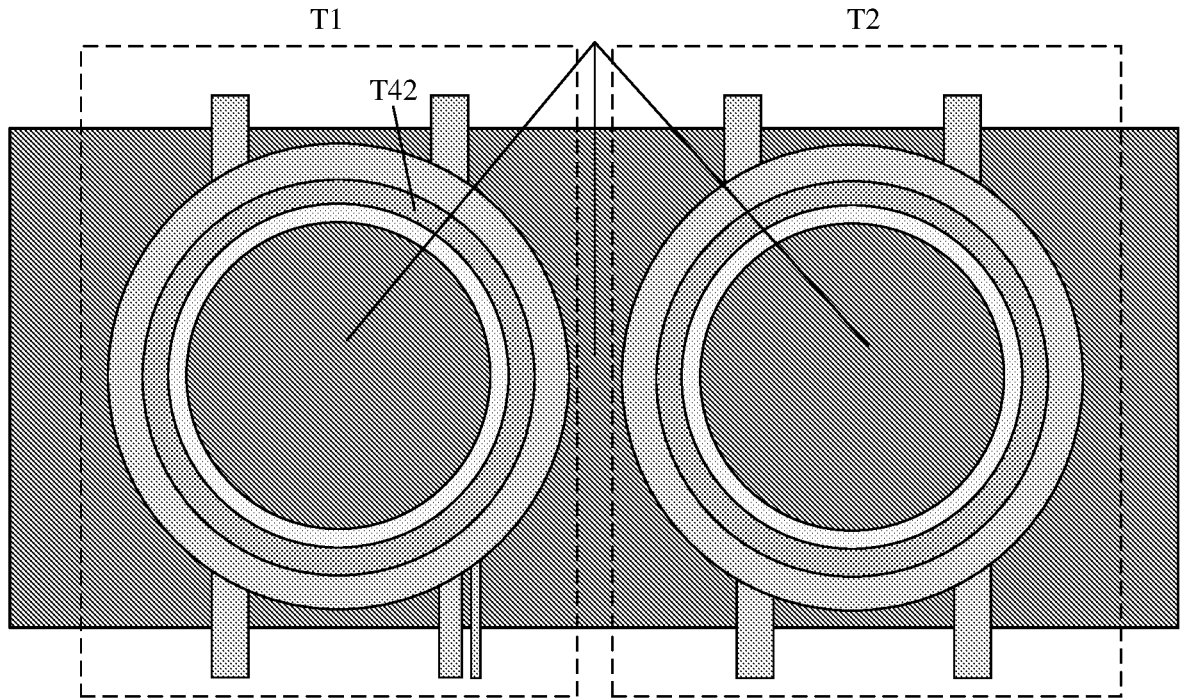
FIG. 33 is a schematic diagram of another integrated transformer according to an embodiment of this application.

FIG. 33 is a schematic diagram of another integrated transformer according to an embodiment of this application.

When a current of a first-transformer secondary-side winding T42 needs to be sampled, the first-transformer secondary-side winding T42 may be split into two parts.

Figure 34:
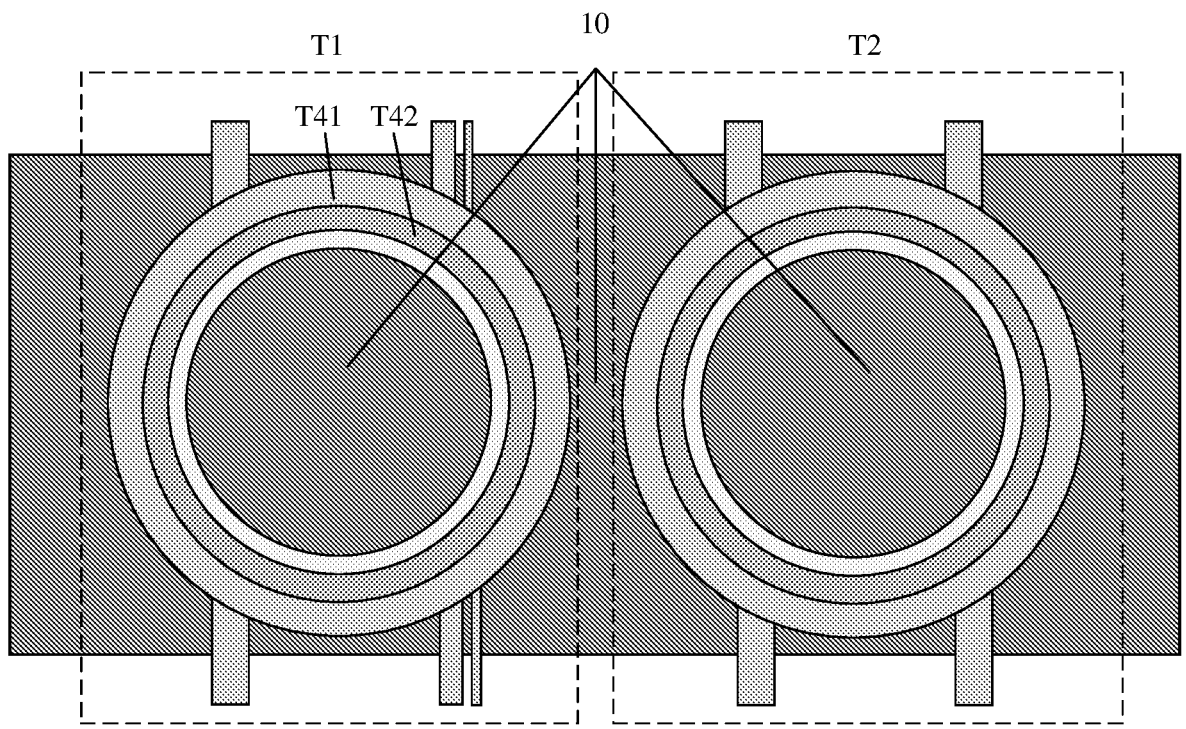
FIG. 34 is a schematic diagram of another integrated transformer according to an embodiment of this application.

FIG. 34 is a schematic diagram of another integrated transformer according to an embodiment of this application.

When both a current of a first-transformer primary-side winding T41 and a current of a first-transformer secondary-side winding T42 need to be sampled, both the first-transformer primary-side winding T41 and the first-transformer secondary-side winding T42 may be split into two parts.

Similarly, when a current of a primary-side winding and/or a current of a secondary-side winding of the second transformer T2 need/needs to be sampled, references may be made to FIG. 32 to FIG. 34. Details are not described herein again.

In addition, when all of a current of a primary-side winding of the first transformer T1, a current of a primary-side winding of the second transformer T1, a current of a secondary-side winding of the first transformer T1, and a current of a secondary-side winding of the second transformer T1 are sampled, all windings on which current sampling needs to be performed may be split. For ease of understanding by a person skilled in the art, the following is described in detail by using an example in which the current of the secondary-side winding of the first transformer T1 and the current of the secondary-side winding of the second transformer T1.

Figure 35:
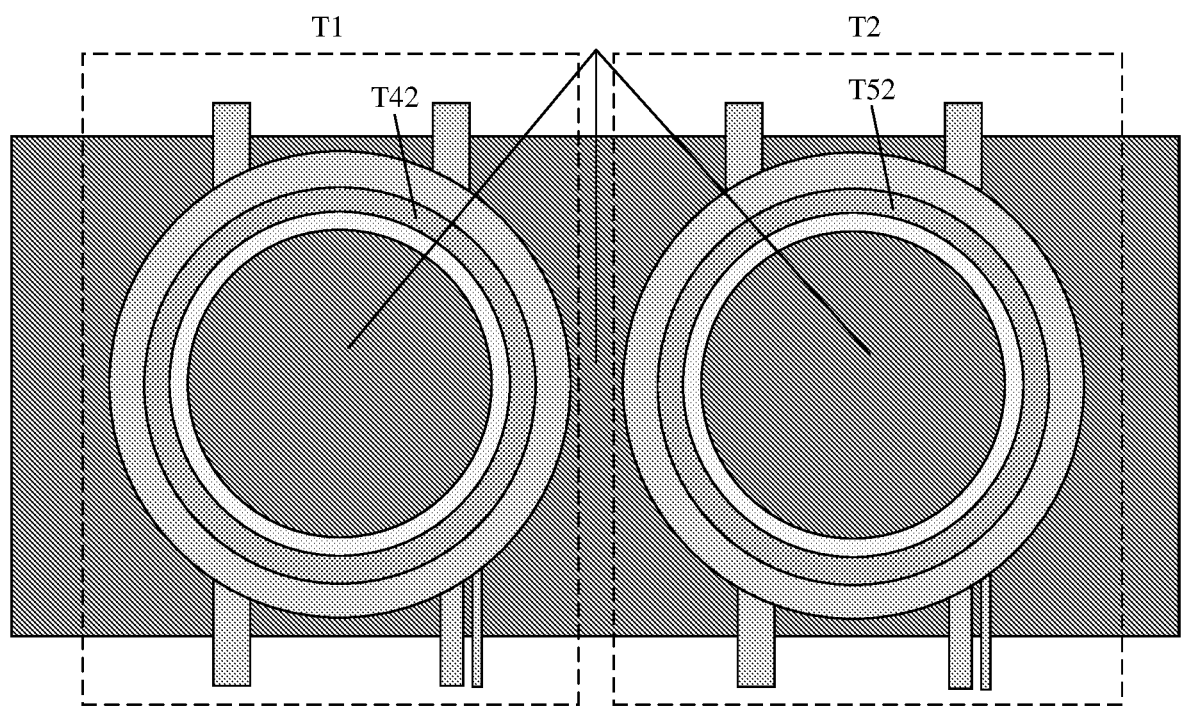
FIG. 35 is a schematic diagram of still another integrated transformer according to an embodiment of this application.

FIG. 35 is a schematic diagram of still another integrated transformer according to an embodiment of this application.

When both the current of the secondary-side winding of the first transformer T1 and the current of the secondary-side winding of the second transformer T2 need to be sampled, both the first-transformer secondary-side winding T42 and the second-transformer secondary-side winding T52 may be split into two parts. For a specific process of splitting both the first-transformer secondary-side winding T42 and the second-transformer secondary-side winding T52 into two parts, refer to FIG. 32 to FIG. 34. Details are not described herein again.

For a specific process of sampling a current of a winding after splitting by using the current detection circuit, refer to FIG. 27. Details are not described herein again.

System Embodiment 4

In the foregoing embodiments, a specific form of the magnetic component and a connection relationship between the current detection circuit and the magnetic component are described. The following describes in detail a working principle of the current detection circuit.

The working principle of the current detection circuit described in this application is applicable to all the foregoing embodiments.

For ease of understanding by a person skilled in the art, with reference to FIG. 7, the following is described in detail by using an example in which the current of the second winding 72 is sampled by using the current detection circuit 50.

A specific implementation of the current detection circuit is not limited in this application. The following describes only three possible implementations of the current detection circuit.

Figure 36:
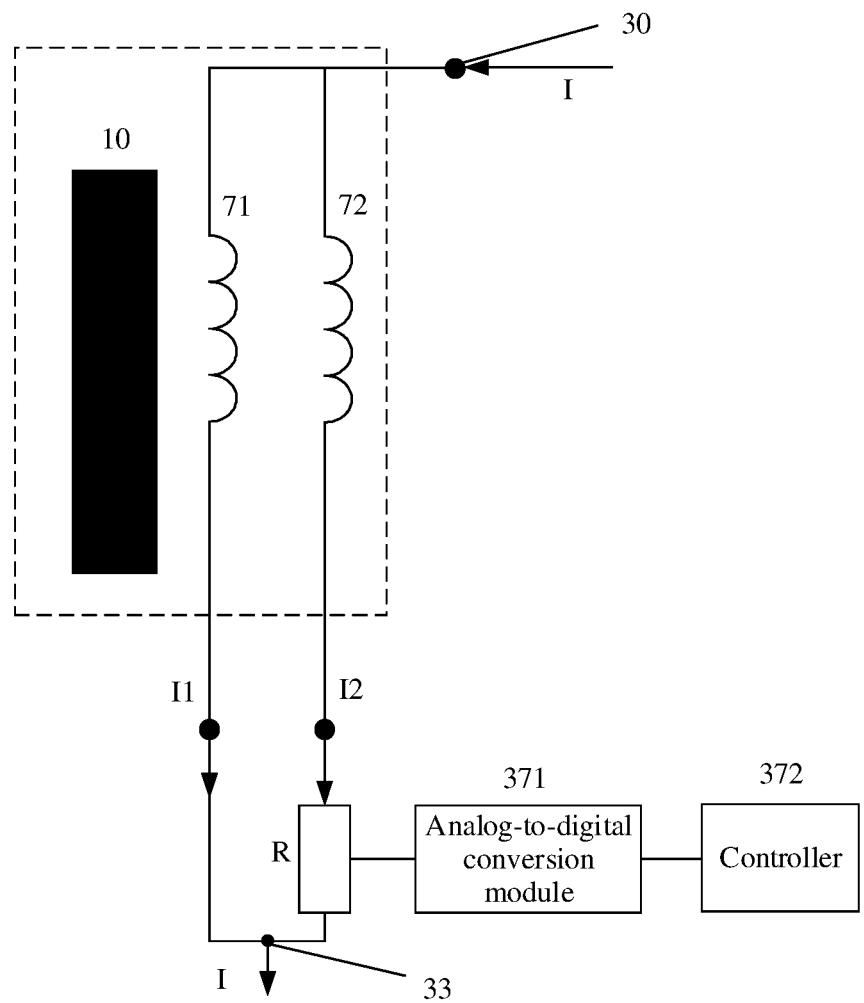
FIG. 36 is a schematic diagram of a current sampling system according to an embodiment of this application.

Implementation 1: FIG. 36 is a schematic diagram of a current sampling system according to an embodiment of this application.

The current detection circuit includes a sampling resistor R, an analog-to-digital conversion module 371, and a controller 372.

A first terminal of the sampling resistor R is connected to the second terminal of the second winding 72. A second terminal of the sampling resistor R and the second terminal of the first winding 71 are connected to a merged pin 33.

When a current flows through the sampling resistor R, a voltage V is generated between the two terminals of the sampling circuit R.

The analog-to-digital conversion module 371 may collect the voltage V between the two terminals of the sampling resistor R, obtain, based on a resistance of the sampling resistor R and the voltage V between the two terminals of the sampling resistor R, the current I2 flowing through the second winding 72, and send the current I2 flowing through the second winding 72 to the controller 372.

After receiving the current I2 of the second winding 72 that is sent by the analog-to-digital conversion module 371, the controller 373 obtains, based on the current I2 of the second winding 72 and the preset ratio, the total current I flowing through the winding. The total current I of the winding is the sum of the current I1 of the first winding 71 and the current I2 of the second winding 72. The preset ratio is a ratio of the quantity N of strands of Litz wires of the winding to the quantity N2 of strands of Litz wires of the second winding. When the quantity of strands of Litz wires of the first winding is N1, the ratio is (N1+N2)/N2.

A current flowing through the sampling resistor R is the current I2 of the second winding 72 instead of the total current I flowing through the winding. The current I2 of the second winding 72 is lower than the total current I of the winding. Therefore, after the winding is split into two parts, a heat loss generated on the sampling resistor R is reduced.

Figure 37:
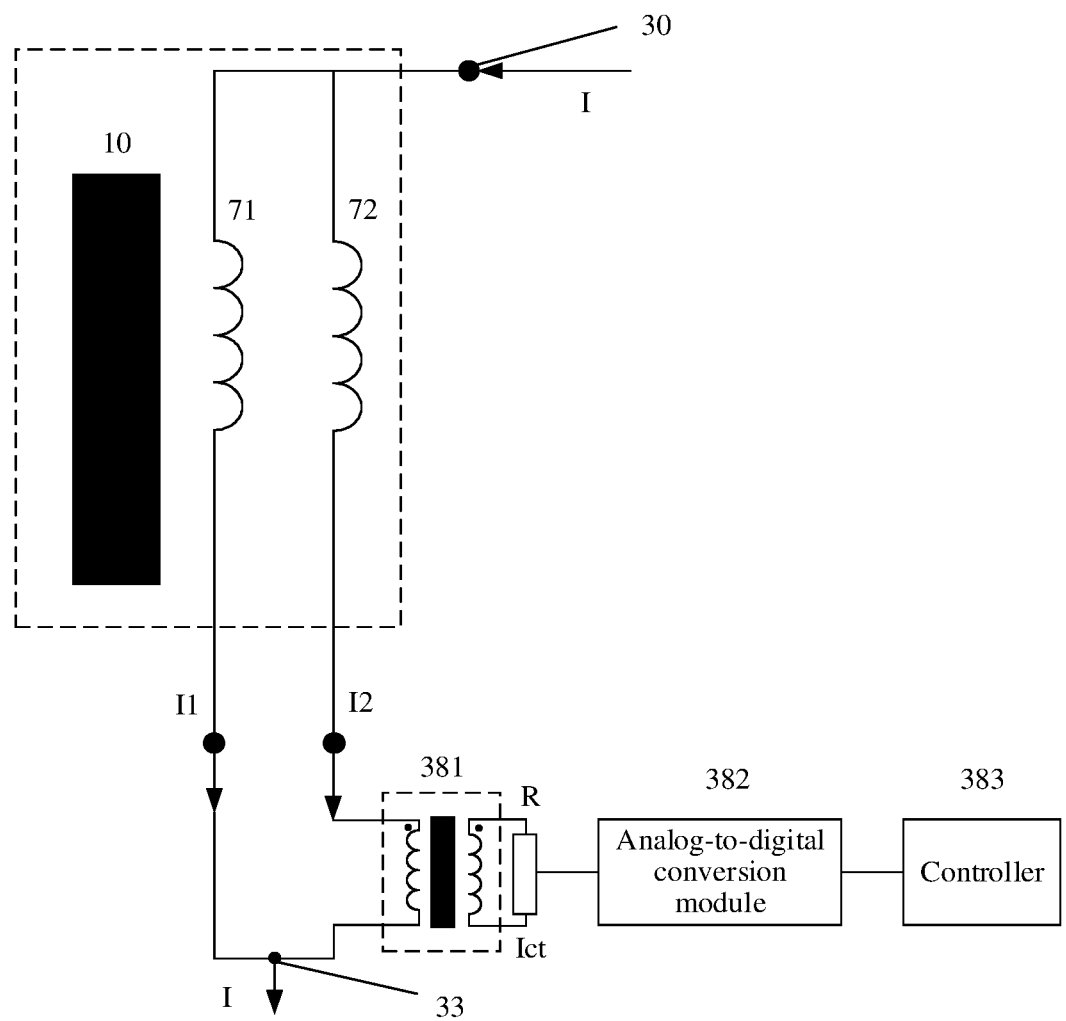
FIG. 37 is a schematic diagram of another current sampling system according to an embodiment of this application.

Implementation 2: FIG. 37 is a schematic diagram of another current sampling system according to an embodiment of this application.

The current detection circuit includes a current transformer 381, a sampling resistor R, an analog-to-digital conversion module 382, and a controller 383.

A first terminal of a primary-side winding of the current transformer 381 is connected to the second terminal of the second winding 72. A second terminal of the primary-side winding of the current transformer 381 and the second terminal of the first winding 71 are connected to a merged pin 33. A first terminal of a secondary-side winding of the current transformer 381 is connected to a first terminal of the sampling resistor R. A second terminal of the secondary-side winding of the current transformer 381 is connected to a second terminal of the sampling resistor R.

The current transformer 381 converts the current I2 of the second winding into a smaller current Ict of the secondary-side winding. After the current Ict of the secondary-side winding flows through the sampling resistor R, a voltage V is generated between the two terminals of the sampling resistor R.

The analog-to-digital conversion module 382 may collect the voltage V between the two terminals of the sampling resistor R, and send the collected voltage V to the controller 383.

After a larger current of the primary-side winding is converted into a smaller current of the secondary-side winding by using the current transformer, a current flowing through the sampling resistor R is further reduced, to reduce a heat loss generated on the sampling resistor R. In addition, the current I2 of the second winding 72 is lower than the total current I of the winding. Therefore, when the larger current of the primary-side winding is converted into the smaller current of the secondary-side winding by using the current transformer, a current transformer with a large capacity is not required, to reduce a volume of the current transformer that needs to be used, and reduce space occupied by the current transformer.

The controller 383 may obtain the corresponding total current I based on V, the sampling resistor R, and the preset ratio. The preset ratio is a ratio of the quantity N of strands of Litz wires of the winding to the quantity N2 of strands of Litz wires of the second winding. When the quantity of strands of Litz wires of the first winding is N1, the ratio is (N1+N2)/N2.

Figure 38:
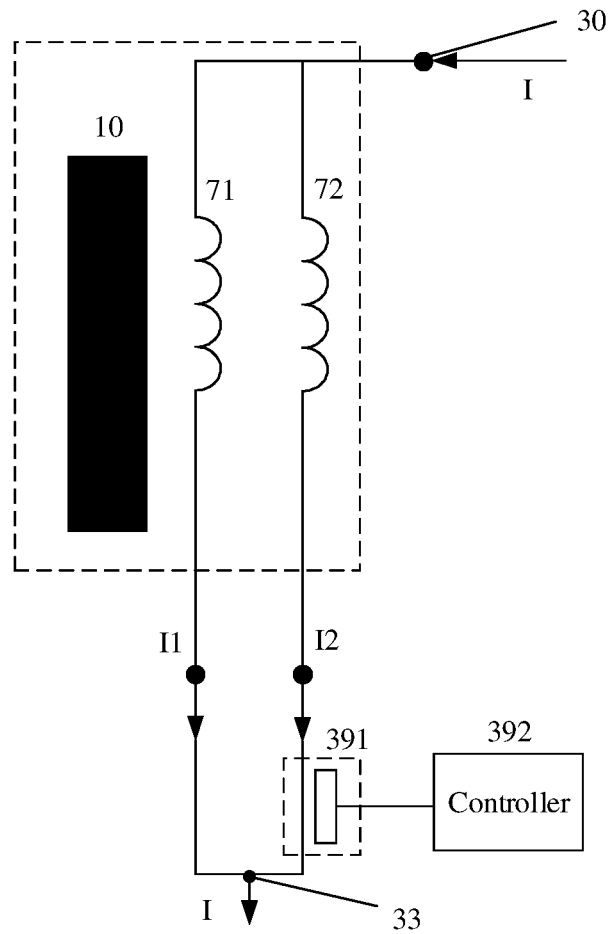
FIG. 38 is a schematic diagram of still another current sampling system according to an embodiment of this application.

Implementation 3: FIG. 38 is a schematic diagram of still another current sampling system according to an embodiment of this application.

The current detection circuit includes a magnetic sensor 391 and a controller 392.

A type of the magnetic sensor 391 is not specifically limited in this application. The magnetic sensor 391 may be any one of a Hall sensor, a tunnel magnetoresistance (TMR, Tunnel Magneto Resistance) sensor, a giant magnetoresistance (GMR, Giant Magneto resistance) sensor, and an anisotropic magnetoresistance (AMR, Anisotropic Magneto resistance) sensor.

The magnetic sensor 391 samples the current I2 of the second winding 72 based on an electromagnetic field generated by the current I2 flowing through the second winding 72. When the magnetic sensor 391 samples the current I2 of the second winding 72, the current I2 does not pass through the magnetic sensor 391, to avoid a problem of a heat loss of the sampling resistor. After obtaining the current I2 of the second winding 72, the magnetic sensor 391 sends the current I2 of the second winding 72 to the controller 392. The controller 392 obtains the total current I of the winding based on the current I2 of the second winding 72 and the preset ratio. The preset ratio is a ratio of the quantity N of strands of Litz wires of the winding to the quantity N2 of strands of Litz wires of the second winding. When the quantity of strands of Litz wires of the first winding is N1, the ratio is (N1+N2)/N2.

In addition to the implementations described in the foregoing embodiment, the current detection circuit may also be established by using a pure analog circuit. For example, a multiplier is formed by using an operational amplifier and a peripheral resistor, and the total current of the magnetic component is obtained by using the multiplier and based on a collected current. The total current in an analog signal form may be converted into a digital signal form by using an analog-to-digital converter and sent to the controller.

Method Embodiment 1

Based on the current sampling system for a magnetic component described above, this application further provides a current sampling method for a magnetic component. The following is described in detail with reference to the accompanying drawings.

Figure 39:
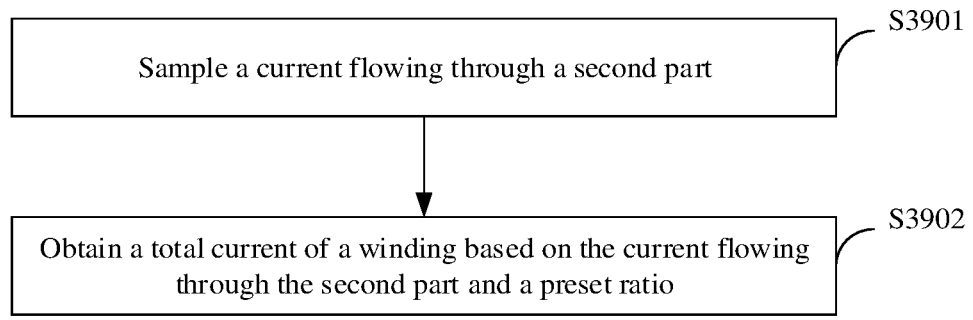
FIG. 39 is a flowchart of a current sampling method according to an embodiment of this application.

FIG. 39 is a flowchart of a current sampling method according to an embodiment of this application.

The current sampling method is applied to a magnetic component. For the magnetic component, refer to the magnetic component shown in FIG. 2, FIG. 6, FIG. 9 to FIG. 12, FIG. 14 to FIG. 16, FIG. 18 to FIG. 25, and FIG. 28 to FIG. 35.

For ease of description, the following describes in detail the current sampling method with reference to FIG. 3.

The current sampling method includes the following.

S3901: Sample a current flowing through a second part.

The magnetic component includes a winding. After the winding is split into a first part and the second part, a total current of the winding is a sum of a current of the first part and a current of the second part. Therefore, both the current flowing through the first part and the current flowing through the second part are lower than the total current of the winding. A current of a part in the first part or the second part is sampled by using a current detection circuit. For example, when the current of the second part is sampled by using the current detection circuit, the current of the second part is lower than the total current of the winding. Therefore, a current value directly sampled by the current detection circuit is low, to reduce a heat loss generated in a circuit.

S3902: Obtain the total current of the winding based on the current flowing through the second part and a preset ratio.

After the current of the second part is obtained, the total current of the winding may be obtained based on the preset ratio. The total current of the windings is the sum of the current of the first part and the current of the second part. The preset ratio is a ratio of the total current flowing through the winding to the current of the second part. The preset ratio may be obtained in advance through experiment.

Therefore, in the current sampling method provided in this application, the winding is split into a plurality of parts, so that the total current of the winding is a sum of currents of the parts, and the current of each part is lower than the total current of the winding. After a current of any part in the parts of the winding is sampled, the total current of the winding may be obtained based on a ratio of the current of the part to the total current of the winding. In the current sampling method, a case in which the total current of the winding is directly sampled can be avoided, only a current of any part of the winding needs to be detected, and the current of the any part is lower than the total current of the winding, so that a to-be-sampled current is reduced. Therefore, in the current sampling method, when a current of the winding is sampled, the to-be-sampled current can be reduced, to reduce a heat loss generated in a circuit.

Embodiment 1 of a Magnetic Component

Based on the current sampling system and the current sampling method that are described above, this application further provides a magnetic component.

A type of the magnetic component is not specifically limited in this application. The magnetic component may be an inductor or a transformer. The magnetic component includes at least one winding.

To enable a current detection circuit to sample a current less than a total current of the winding, in this application, the winding that is in the magnetic component and on which current sampling is to be performed is split into at least two parts, and may be split into two parts, or may be split into more parts, for example, three parts or four parts. This is not specifically limited in this application. For ease of description and for ease of implementation by a person skilled in the art, the following is described by using an example in which the winding is split into two parts.

With reference to FIG. 2, the winding includes a first part 21 and a second part 22.

A first terminal of the first part 21 and a first terminal of the second part 22 are connected to a common pin 30. A second terminal of the first part 21 is separated from a second terminal of the second part 22.

With reference to FIG. 3, the second terminal of the second part 22 is connected to a first terminal of a current detection circuit 50, and the second terminal of the first part 21 and a second terminal of the current detection circuit 50 are connected to a merged pin 33. The current detection circuit 50 samples a current flowing through the second part, and obtains the total current of the winding based on the current flowing through the second part and a preset ratio. The total current of the winding is a sum of a current of the first part and the current of the second part. The preset ratio is a ratio of the total current flowing through the winding to the current of the second part. The preset ratio may be obtained in advance through experiment.

Therefore, in the magnetic component provided in this application, the winding of the magnetic component is split into a plurality of parts, so that the total current of the winding is a sum of currents of the parts, and the current of each part is lower than the total current of the winding. After sampling a current of any part in the parts of the winding, a current detection circuit may obtain the total current of the winding based on a ratio of the current of the part to the total current of the winding. Therefore, a case in which the total current of the winding is directly sampled by using the current sampling circuit is avoided, the current detection circuit needs to sample only a current of any part of the winding, and the current of the any part is lower than the total current of the winding, so that a to-be-sampled current is reduced, to reduce a heat loss generated in a circuit.

Embodiment 2 of a Magnetic Component

A winding described in this embodiment is formed by winding a Litz wire.

The magnetic component may be an inductor or a transformer. In this embodiment, two cases are described. A first case is described by using an example in which the magnetic component is an inductor, and a second case is described by using an example in which the magnetic component is a transformer.

Case 1: When the magnetic component is an inductor, a winding of the inductor is formed by winding N strands of Litz wires.

To enable a current detection circuit to sample a current smaller than a total current of the winding formed by winding the N strands of Litz wires, the winding is split into two parts in this application.

With reference to FIG. 6, the winding includes a first winding 71 and a second winding 72.

A quantity of strands of Litz wires of the first winding 71 is N1, a quantity of strands of Litz wires of the second winding 72 is N2, and a sum of the quantity N1 of strands of Litz wires of the first winding 71 and the quantity N2 of strands of Litz wires of the second winding 72 is N, that is, N1+N2=N.

When the inductor is an integrated inductor, for a specific form of the magnetic component, refer to System embodiment 2 provided in this application and FIG. 10 to FIG. 12. Details are not described herein again.

Case 2: When the magnetic component is a transformer, for a specific form of the magnetic component, refer to System embodiment 2 provided in this application and FIG. 14 to FIG. 16. Details are not described herein again.

When the transformer is an integrated transformer, for a specific form of the magnetic component, refer to System embodiment 2 provided in this application and FIG. 18 to FIG. 24. Details are not described herein again.

Embodiment 3 of a Magnetic Component

The winding of the magnetic component described in the foregoing embodiment is formed by winding the Litz wire, and a winding of the magnetic component described in this embodiment is a PCB winding.

The magnetic component may be an inductor or a transformer. In this embodiment, two cases are described. A first case is described by using an example in which the magnetic component is an inductor, and a second case is described by using an example in which the magnetic component is a transformer.

Case 1: When the magnetic component is an inductor, for a specific form of the magnetic component, refer to System embodiment 3 provided in this application and FIG. 25. Details are not described herein again.

When the inductor is an integrated inductor, for a specific form of the magnetic component, refer to System embodiment 3 provided in this application and FIG. 28. Details are not described herein again.

Case 2: When the magnetic component is a transformer, for a specific form of the magnetic component, refer to System embodiment 3 provided in this application and FIG. 29 to FIG. 31. Details are not described herein again.

When the transformer is an integrated transformer, for a specific form of the magnetic component, refer to System embodiment 3 provided in this application and FIG. 32 to FIG. 35. Details are not described herein again.

Power Converter Embodiment

Based on the current sampling system for a magnetic component provided in the foregoing embodiments, an embodiment of this application further provides a power converter. The power converter includes the foregoing current sampling system for a magnetic component, and further includes a high-frequency switching transistor.

The power converter is any one of a direct current-direct current (DC-DC) converter, a rectifier, an inverter, a power adapter, an uninterruptible power supply, and a battery management system.

An application scenario of the rectifier is not specifically limited, and the inverter may be an ordinary inverter or a photovoltaic inverter. The uninterruptible power supply may be applied to the communication field to supply power to a communication device. The battery management system (BMS) may be a battery management system of a communication device or an electric vehicle.

The magnetic component is generally used together with the high-frequency switching transistor, and both the magnetic component and the high-frequency switching transistor are high-frequency components. A high frequency herein is relative to a power frequency, and is a frequency higher than the power frequency.

For the power converter having the current sampling system for a magnetic component, because a detected current is small, a loss can be reduced.

It should be understood that, in this application, "at least one (item)" means one or more, and "a plurality of" means two or more. The term "and/or" is used for describing an association relationship between associated objects, and represents that three relationships may exist. For example, "A and/or B" may represent the following three cases: Only A exists, only B exists, and both A and B exist, where A and B may be singular or plural. The character "/" usually indicates an "or" relationship between associated objects. "At least one of the following items (pieces)" or a similar expression thereof refers to any combination of these items, including any combination of singular items (pieces) or plural items (pieces). For example, at least one of a, b, or c may indicate a, b, c, a and b, a and c, b and c, or a, b, and c, where a, b, and c may be singular or plural.

The foregoing embodiments are merely intended for describing the technical solutions of this application, but not for limiting this application. Although this application is described in detail with reference to the foregoing embodiments, persons of ordinary skill in the art should understand that they may still make modifications to the technical solutions described in the foregoing embodiments or make equivalent replacements to some technical features thereof, without departing from the spirit and scope of the technical solutions of embodiments of this application.

What is claimed is:

1. A current sampling system for a magnetic component, comprising:
    a magnetic component, wherein the magnetic component is an inductor or a transformer, and wherein the inductor or the transformer comprises at least one winding, wherein the at least one winding comprises at least a first part and a second part, wherein a first terminal of the first part is connected to a first terminal of the second part, and wherein a second terminal of the first part is separated from a second terminal of the second part; and
    a current detection circuit configured to
        sample a current flowing through the second part and
        obtain a total current of the winding based on the sampled current flowing through the second part and a preset ratio,
    wherein the current detection circuit comprises:
    a sampling component;
    an analog-to-digital conversion module; and
    a controller;
        wherein a first terminal of the sampling component is connected to the second terminal of the second part, and a second terminal of the sampling component is connected to the second terminal of the first part;
        wherein the analog-to-digital conversion module is configured to:
            obtain, based on samples from the sampling component, the current flowing through the second part; and
            send the current flowing through the second part to the controller; and
        wherein the controller is configured to obtain the total current of the winding based on the current flowing through the second part and the preset ratio, wherein the total current of the winding is a sum of a current flowing through the first part and the current flowing through the second part.

2. The system according to claim 1, wherein the at least one winding is configured to provide the current flowing through the first part to be greater than the current flowing through the second part.

3. The system according to claim 2, wherein the winding comprises wound Litz wires, wherein the first part comprises N1 strands of Litz wires, wherein the second part comprises N2 strands of Litz wires, wherein both N1 and N2 are positive integers, and wherein the preset ratio is (N1+N2)/N2.

4. The system according to claim 3, wherein N1 is greater than N2.

5. The system according to claim 2, wherein the winding is a printed circuit board (PCB) winding, wherein a width of the first part is B1, wherein a width of the second part is B2, and wherein the preset ratio is (B1+B2)/B2.

6. The system according to claim 5, wherein B1 is greater than B2.

7. The system according to claim 1, wherein the preset ratio is a ratio of the total current flowing through the winding to the current flowing through the second part, and wherein the preset ratio is predetermined.

8. The system according to claim 7, wherein the magnetic component is an inductor, and wherein the inductor is an integrated inductor.

9. The system according to claim 7, wherein the magnetic component is a transformer, and wherein the winding is at least one of a primary-side winding or a secondary-side winding of the transformer.

10. The system according to claim 9, wherein the transformer is an integrated transformer, and wherein the winding is at least one of a primary-side winding and a secondary-side winding of the integrated transformer.

11. The system according to claim 1, wherein:
    the sampling component is a sampling resistor; and
        wherein a first terminal of the sampling resistor is connected to the second terminal of the second part, and a second terminal of the sampling resistor is connected to the second terminal of the first part;
        wherein the analog-to-digital conversion module is configured to:
            collect a voltage between the first terminal and second terminal of the sampling resistor; and
            obtain, based on a resistance of the sampling resistor and the voltage between the two terminals of the sampling resistor, the current flowing through the second part.

12. The system according to claim 1, wherein:
    the sampling component comprises:
        a current transformer; and
        a sampling resistor;
    wherein a first terminal of a primary-side winding of the current transformer is connected to the second terminal of the second part, wherein a second terminal of the primary-side winding of the current transformer is connected to the second terminal of the first part, and wherein a first terminal and a second terminal of a secondary-side winding of the current transformer are respectively connected to two terminals of the sampling resistor;
    wherein the analog-to-digital conversion module is configured to:
        collect a voltage between the two terminals of the sampling resistor; and
        obtain, based on a resistance of the sampling resistor and the voltage between the two terminals of the sampling resistor, the current flowing through the second part.

13. The system according to claim 1, wherein the sampling component comprises a magnetic sensor;
    wherein the magnetic sensor is configured to
        collect the current flowing through the second part; and
    wherein the analog-to-digital conversion module is configured to:
        obtain, from the magnetic sensor, the current flowing through the second part; and send the current flowing through the second part to the controller.

14. A current sampling method for a magnetic component, comprising:
sampling a current flowing through a second part of a winding that is of a magnetic component and that comprises at least a first part and the second part, wherein the magnetic component is an inductor or a transformer, wherein a first terminal of the first part is connected to a first terminal of the second part, wherein a second terminal of the first part is separated from a second terminal of the second part, and wherein the second terminal of the second part is connected to a current detection circuit; and
obtaining a total current of the winding based on the current flowing through the second part and a preset ratio, wherein the total current of the winding is a sum of a current flowing through the first part and the current flowing through the second part,
wherein the current detection circuit comprises:
a sampling component;
an analog-to-digital conversion module; and
a controller;
wherein a first terminal of the sampling component is connected to the second terminal of the second part, and a second terminal of the sampling component is connected to the second terminal of the first part;
wherein the analog-to-digital conversion module is configured to:
obtain, based on samples from the sampling component, the current flowing through the second part; and
send the current flowing through the second part to the controller; and
wherein the controller is configured to obtain the total current of the winding based on the current flowing through the second part and the preset ratio, wherein the total current of the winding is a sum of the current flowing through the first part and the current flowing through the second part.

15. A magnetic component, wherein the magnetic component is an inductor or a transformer, and wherein the inductor or the transformer comprises at least one winding;
wherein the at least one winding comprises a first part and a second part;
wherein a first terminal of the first part is connected to a first terminal of the second part, and wherein a second terminal of the first part is separated from a second terminal of the second part; and
wherein the second terminal of the second part is configured to be connected to a current detection circuit, the connecting the current detection circuit causing the current detection circuit to obtain a total current of the winding based on a current flowing through the second part and a preset ratio, and wherein the total current of the winding is a sum of a current flowing through the first part and the current flowing through the second part, and
wherein the current detection circuit comprises:
a sampling component;
an analog-to-digital conversion module; and
a controller;
wherein a first terminal of the sampling component is connected to the second terminal of the second part, and a second terminal of the sampling component is connected to the second terminal of the first part;
wherein the analog-to-digital conversion module is configured to:
obtain, based on samples from the sampling component, the current flowing through the second part; and
send the current flowing through the second part to the controller; and
wherein the controller is configured to obtain the total current of the winding based on the current flowing through the second part and the preset ratio, wherein the total current of the winding is a sum of the current flowing through the first part and the current flowing through the second part.

16. The magnetic component according to claim 15, wherein the winding comprises wound Litz wires, wherein the first part comprises N1 strands of Litz wires, wherein the second part comprises N2 strands of Litz wires, wherein both N1 and N2 are positive integers, and wherein the preset ratio is (N1+N2)/N2.

17. The magnetic component according to claim 15, wherein the winding is a printed circuit board (PCB) winding, wherein a width of the first part is B1, wherein a width of the second part is B2, and wherein the preset ratio is (B1+B2)/B2.

18. The magnetic component according to claim 15, wherein the magnetic component is an inductor, and wherein the inductor is an integrated inductor.

19. The magnetic component according to claim 15, wherein the magnetic component is a transformer, and wherein the winding is at least one of a primary-side winding and a secondary-side winding of the transformer.

20. The magnetic component according to claim 15, wherein the transformer is an integrated transformer, and wherein the winding is at least one of a primary-side winding and a secondary-side winding of the integrated transformer.

* * * * *